(12) United States Patent
Cohen

(10) Patent No.: US 7,229,544 B2
(45) Date of Patent: Jun. 12, 2007

(54) MULTI-CELL MASKS AND METHODS AND APPARATUS FOR USING SUCH MASKS TO FORM THREE-DIMENSIONAL STRUCTURES

(75) Inventor: Adam L. Cohen, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 339 days.

(21) Appl. No.: 10/677,546

(22) Filed: Oct. 1, 2003

(65) Prior Publication Data

US 2004/0129573 A1 Jul. 8, 2004

Related U.S. Application Data

(60) Provisional application No. 60/429,485, filed on Nov. 26, 2002, provisional application No. 60/415,369, filed on Oct. 1, 2002.

(51) Int. Cl.
C25D 5/02 (2006.01)
(52) U.S. Cl. ............... 205/118; 205/122; 205/135; 205/170
(58) Field of Classification Search ........... 205/118, 205/122, 135, 170
See application file for complete search history.

(56) References Cited

U.S. PATENT DOCUMENTS

| | | | | |
|---|---|---|---|---|
| 6,027,630 A | * | 2/2000 | Cohen | 205/135 |
| 6,468,806 B1 | * | 10/2002 | McFarland et al. | 436/518 |
| 6,475,369 B1 | * | 11/2002 | Cohen | 205/135 |
| 6,572,742 B1 | * | 6/2003 | Cohen | 204/297.05 |

* cited by examiner

*Primary Examiner*—Nam Nguyen
*Assistant Examiner*—Luan V. Van
(74) *Attorney, Agent, or Firm*—Dennis R. Smalley

(57) ABSTRACT

Multilayer structures are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibit significant deposition or etching. Single cell masks having a cell size that is smaller or equal to the desired deposition resolution may also be used to form structures.

24 Claims, 27 Drawing Sheets

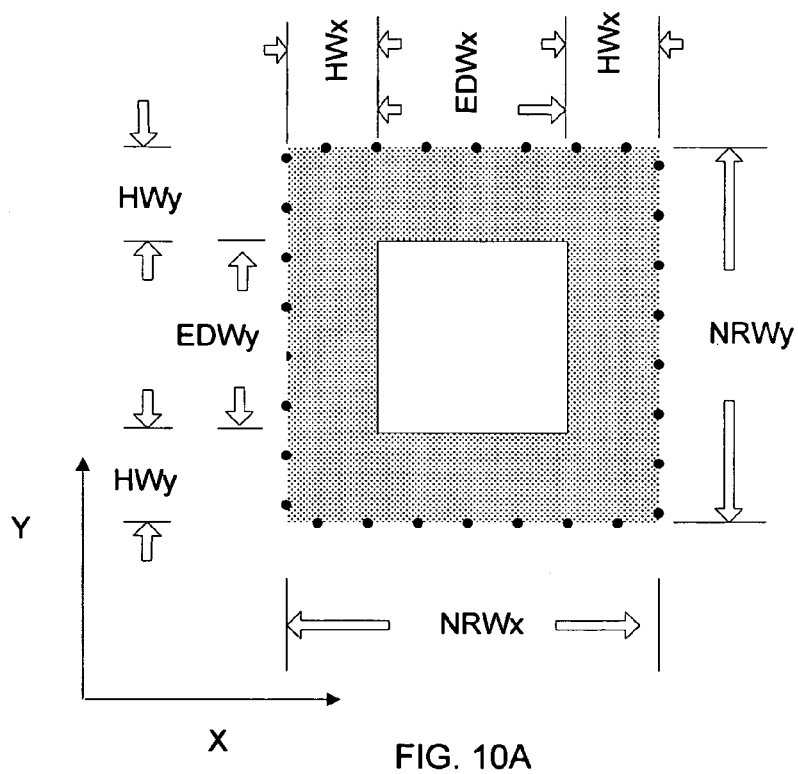
FIG. 10A
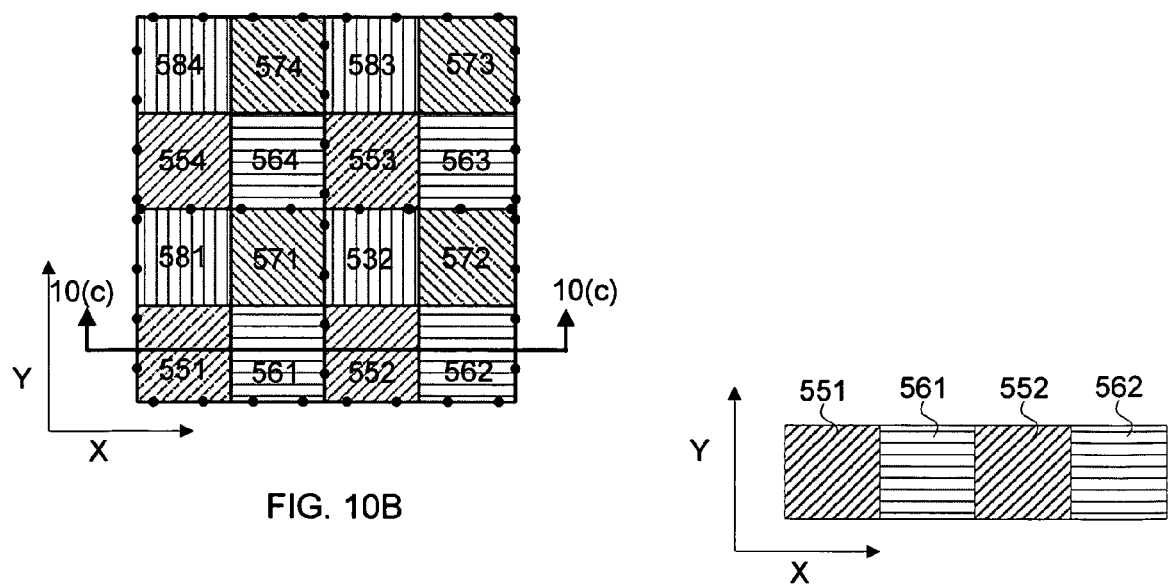
FIG. 10B
FIG. 10C

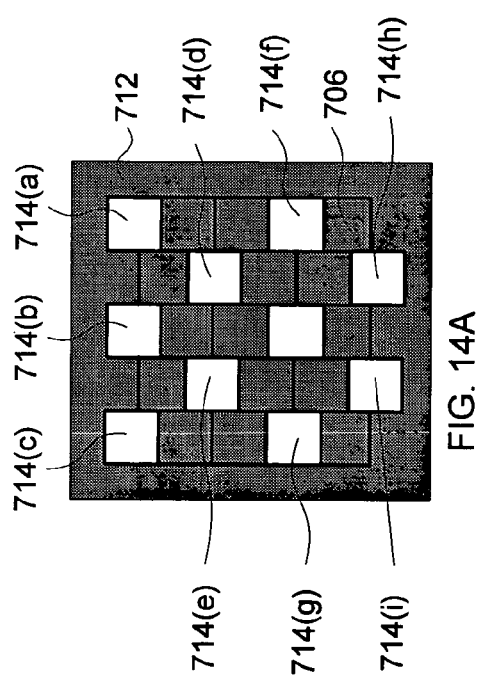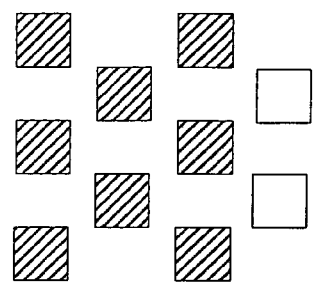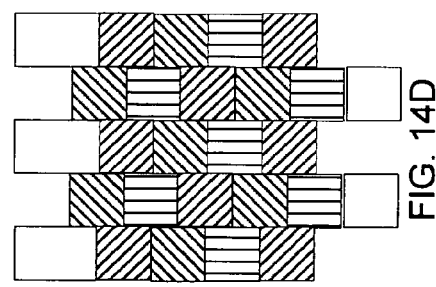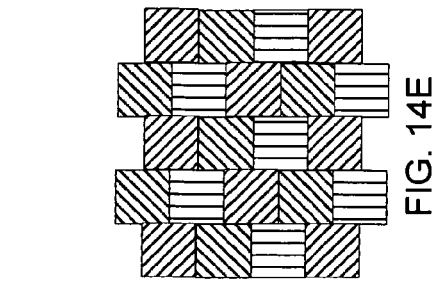

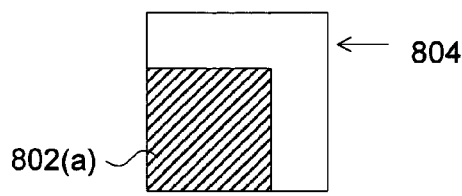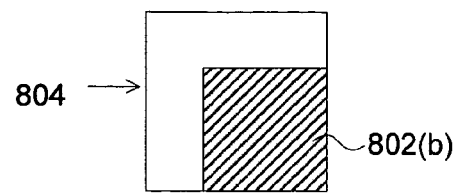
FIG. 18A  FIG. 18B
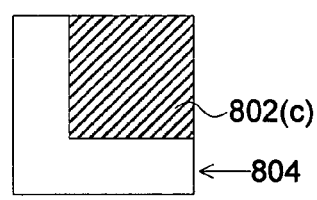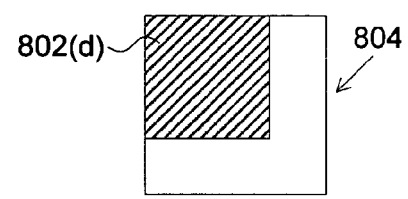
FIG. 18C  FIG. 18D
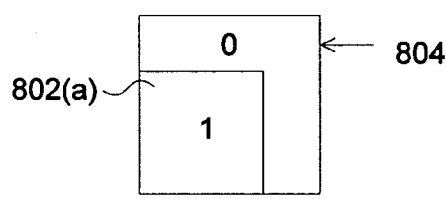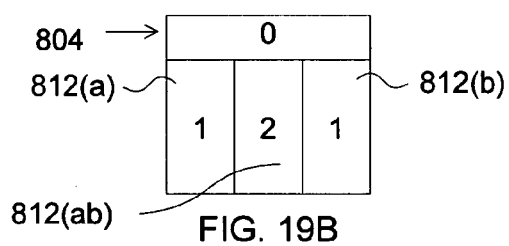
FIG. 19A  FIG. 19B
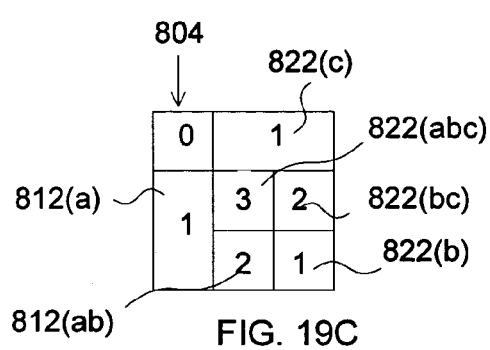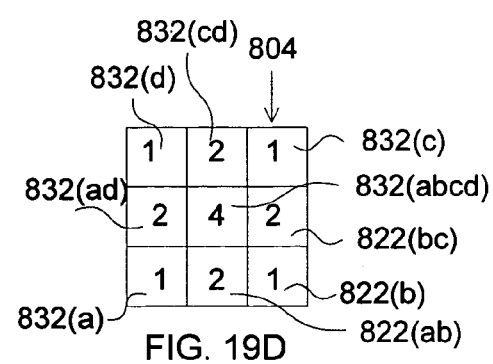
FIG. 19C  FIG. 19D

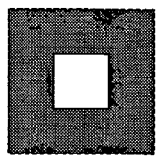
FIG. 20
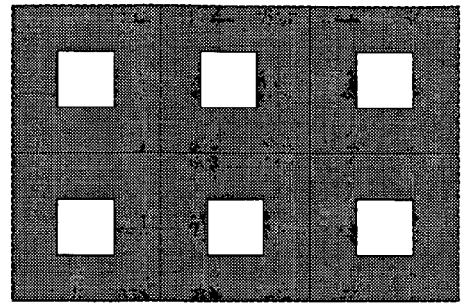
FIG. 21
FIG. 22
FIG. 23

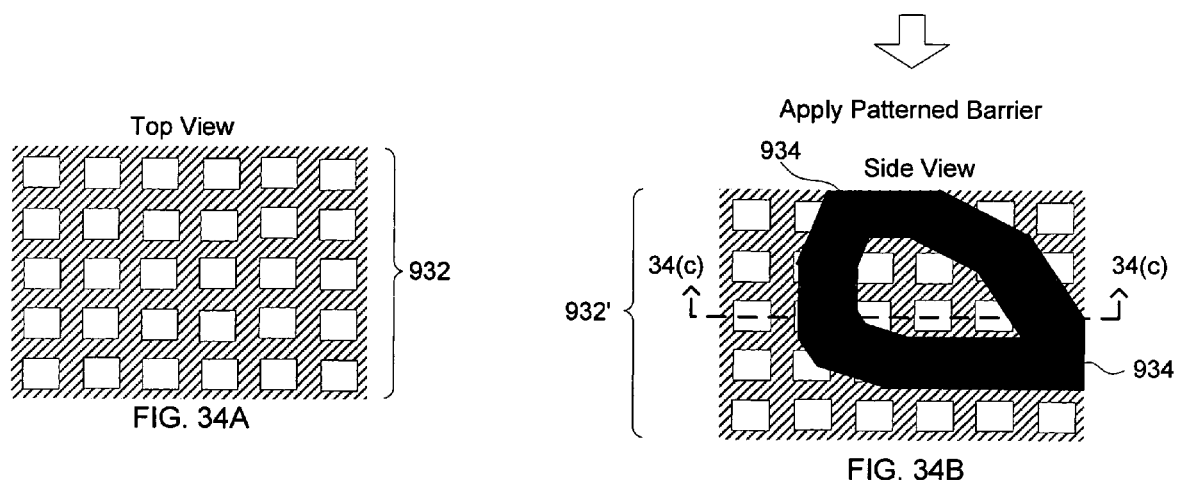
FIG. 34A
FIG. 34B
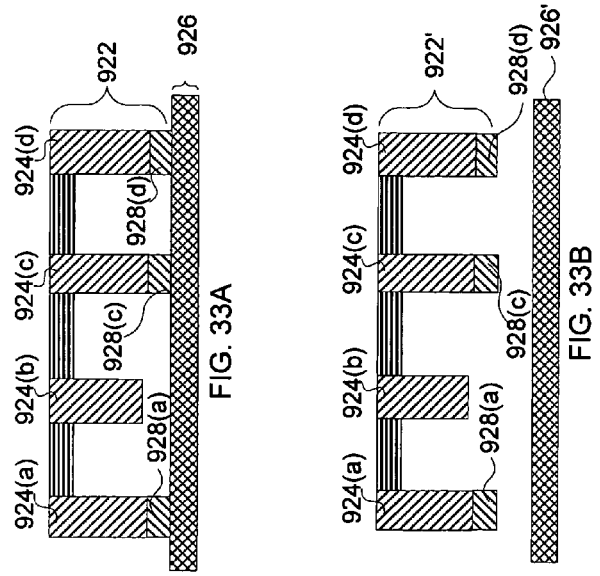
FIG. 33A
FIG. 33B
FIG. 34C

MULTI-CELL MASKS AND METHODS AND APPARATUS FOR USING SUCH MASKS TO FORM THREE-DIMENSIONAL STRUCTURES

RELATED APPLICATIONS

This application claims benefit to U.S. Provisional Patent Application 60/429,485, filed Nov. 26, 2002 and to U.S. Provisional Patent Application 60/415,369, filed Oct. 1, 2002. These patent applications along with all other mentioned herein are incorporated herein by reference as if set fourth in full.

FIELD OF THE INVENTION

The present invention relates generally to the field of three-dimensional structure fabrication. In some embodiments, meso-scale or microscale structures are formed via electrochemical operations (e.g. Electrochemical Fabrication or EFAB™ processes, such as electrochemical deposition operations and/or etching operations). In some embodiments the structures are formed via deposition of a single layer of material while in other embodiments the structures are formed via a layer-by-layer build up of deposited materials. In particular, selective patterning of effective deposition regions occurs via one or more masks having independently controllable regions.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1–5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A–1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D–1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A–2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A–3C. The system 32 consists of several subsystems 34, 36, 38, and 40. The substrate holding subsystem 34 is depicted in the upper portions of each of FIGS. 3A–3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions. In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists. For example, formation of individual masks for each layer can be expensive and time consuming. Such individualized masks must also be recreated for even minor design changes. A need exists in the field for a simplified manner and less restrictive manner for obtaining selective deposition of material in an electrochemical fabrication process.

SUMMARY OF THE INVENTION

It is an object of various aspects of the present invention to provide a less restrictive technique for obtaining selective deposition of material.

It is an object of various aspects of the present invention to provide a simplified electrochemical fabrication process.

Other objects and advantages of various aspects of the invention will be apparent to those of skill in the art upon review of the teachings herein. The various aspects of the invention, set forth explicitly herein or otherwise ascertained from the teaching herein, may address any one of the above objects alone or in combination, or alternatively may address some other object of the invention ascertained from the teachings herein. It is not intended that all of, or necessarily any of, the above objects be addressed by any single aspect of the invention even though that may be the case with regard to some aspects.

In a first aspect of the invention a process for forming a multilayer three-dimensional structure, includes: (a) forming a layer of at least one material on a substrate that may include one or more previously deposited layers of one or more materials; (b) repeating the forming operation of "(a)" one or more times to form at least one subsequent layer on at least one previously formed layer to build up a three-dimensional structure from a plurality layers; wherein the forming of at least one layer, includes: (1) supplying a substrate on which one or more successive depositions of one or more materials may have occurred and will occur; (2) supplying a multi-cell mask, wherein each cell is separated from other cells by a material, wherein the cells of the mask include independently controllable electrodes, and wherein a pattern of dielectric material extends beyond the cell electrodes for contacting the substrate and for forming electrochemical process pockets when such contact is made; (3) bringing the multi-cell mask and the substrate into contact such that electrochemical process pockets are formed having a desired registration with respect to any previous depositions and providing a desired electrolyte solution such that the solution is provided within the electrochemical process pockets; and (4) applying a desired electrical activation to desired cell electrodes, to the substrate, and to any other desired electrodes, such that a desired material is selectively deposited onto the substrate.

In a second aspect of the invention a process for modifying a substrate includes: (a) supplying a substrate on which one or more successive depositions of one or more materials may have occurred; (b) supplying a multi-cell mask, wherein each cell is separated from other cells by a material, wherein the cells of the mask include independently controllable electrodes, and wherein a pattern of dielectric material extends beyond the cell electrodes for contacting the substrate and for forming electrochemical process pockets when such contact is made; (c) bringing the multi-cell mask and the substrate into contact such that electrochemical process pockets are formed having a desired registration with respect to any previous depositions and providing a desired electrolyte solution such that the solution is provided within the electrochemical process pockets; and (d) applying a desired electrical activation to at least one desired cell electrode, to the substrate, and to any other desired electrode or electrodes, such that a desired material is selectively deposited onto the substrate.

In a third aspect of the invention a process for a multi-cell mask includes: a plurality of independently controllable cells, wherein each cell is separated from other cells by a material, wherein the cells of the mask include independently controllable electrodes, and wherein a pattern of dielectric material extends beyond the cell electrodes for contacting a substrate and for forming electrochemical process pockets when such contact is made.

In a fourth aspect of the invention a process for forming a multilayer three-dimensional structure includes: (a) a substrate on which one or more successive depositions of one or more materials may have occurred; (b) a mask having multiple cells, wherein each cell is separated from other cells by a material, wherein the cells of the mask include independently controllable electrodes, and wherein a pattern of dielectric material extends beyond the cell electrodes for contacting the substrate and for forming electrochemical process pockets when such contact is made; (c) a computer controlled stage for bringing the multi-cell mask and the substrate into contact such that electrochemical process pockets are formed having a desired registration with respect to any previous depositions and providing a desired electrolyte solution such that the solution is provided within the electrochemical process pockets; (d) at least one power supply for applying desired electrical power to the substrate, to selected cell electrodes, and to any other electrodes required to cause selective deposition onto the substrate; (e) at least one computer programmed for repeatedly controlling the stage, for controlling selected cell electrodes, and for controlling the supply of power from the power supply to cause selective deposition onto the substrate to deposit at least portions of a plurality of layers of material on previously formed layers when forming a desired structure from a plurality of layers.

In a fifth aspect of the invention a process for modifying a substrate includes: (a) a substrate on which one or more successive depositions of one or more materials may have occurred and will occur; (b) a mask having multiple cells, wherein each cell is separated from other cells by a material, wherein the cells of the mask include independently controllable electrodes, and wherein a pattern of dielectric material extends beyond the cell electrodes for contacting the substrate and for forming electrochemical process pockets when such contact is made; (c) a stage for bringing the multi-cell mask and the substrate into contact such that electrochemical process pockets are formed having a desired registration with respect to any previous depositions and providing a desired electrolyte solution such that the solution is provided within the electrochemical process pockets; (d) at least one power supply for applying desired electrical power to the substrate, to selected cell electrodes, and to any other electrodes required to cause selective deposition onto the substrate; (e) at controller for controlling selected cell electrodes and for controlling the supply of power from the power supply to cause selective deposition onto the substrate to deposit at least a portion of a layer of material onto the substrate.

Further aspects of the invention will be understood by those of skill in the art upon review of the teachings herein. Other aspects of the invention may involve apparatus that can be used in implementing one or more of the above method aspects of the invention. Still other aspects may involve use of the multi-cell masks set forth herein for forming single layers. Still other aspects of the invention may provide multi-cell masks configured according to the various embodiments set forth herein or generalizations thereof. These other aspects of the invention may provide various combinations of the aspects presented above as well as provide other configurations, structures, functional relationships, and processes that have not been specifically set forth above.

BRIEF DESCRIPTION OF THE DRAWINGS

FIG. 6A depicts a top view of a multi-cell mask having passages that extend through the cells of the mask and ring electrodes that surround the passages, while

FIG. 10A depicts the opening of one cell of a multi-cell mask where the opening width is about one-half the region width or little less.

FIGS. 10B and 10C depict top and side views, respectively, of a sample deposition that may be performed using the mask of FIG. 10A where no overlap occurs between adjacent depositions.

FIGS. 14A–14E depict a mask containing square openings spaced in a partially staggered pattern of approximately the same dimensions as the openings and an associated three-step non-overlapping deposition pattern that may be used with such a mask.

FIGS. 18A–18D depict deposition locations for each of four offsets of a mask that is similar to that shown in FIGS. 8A and 8B where the resulting net deposition pattern is similar to that of FIGS. 9A and 9B.

FIGS. 19A–19D provide combined deposition height accounting for each of the four steps of FIGS. 18A–18D across the region that the cell covers.

FIGS. 20 and 21 depict top views of a single cell of a multi-cell mask and multiple cells of such a mask, respectively, where the cell size and pattern of cells may be used in an etching operation to remove material from regions of overlapped deposits.

FIG. 22 depicts a sample pattern that might be deposited by six cells of a multi-cell mask making depositions similar to that of FIG. 19D where four of the cells actively participate in the deposition.

FIG. 23 depicts the sample deposits of FIG. 22 after a single etching operation using the mask of FIG. 21 to reduce the height of the tallest deposition.

FIGS. 33A–33B depict a process for changing the height of selected dielectric dividers according to an embodiment of the invention where material is transferred to the dividers.

FIGS. 34A–34C depict a process for forming a pattern over the dielectric dividers to modify the contact area of a multi-cell mask.

DETAILED DESCRIPTION OF PREFERRED EMBODIMENTS OF THE INVENTION

FIGS. 1A–1G, 2A–2F, and 3A–3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
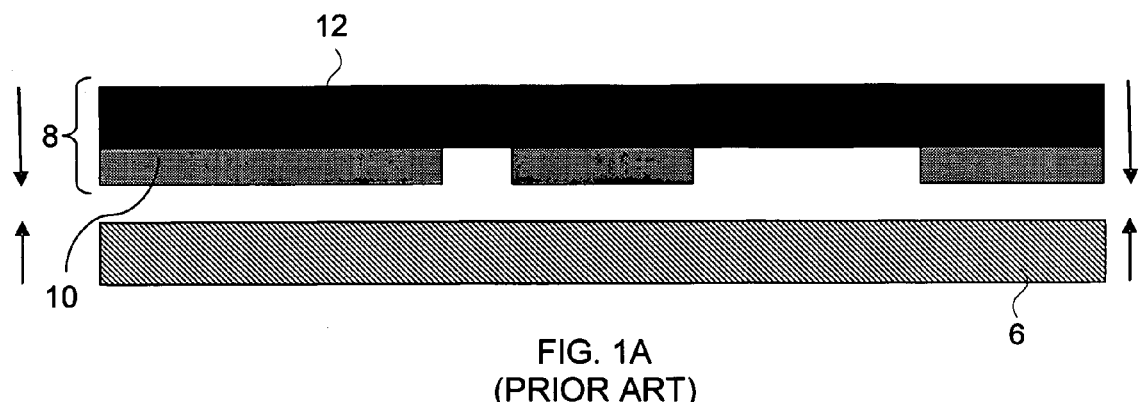
FIGS. 1A–1C schematically depict side views of various stages of a CC mask plating process, while FIGS. 1D–G schematically depict a side views of various stages of a CC mask plating process using a different type of CC mask.
Figure 1B:
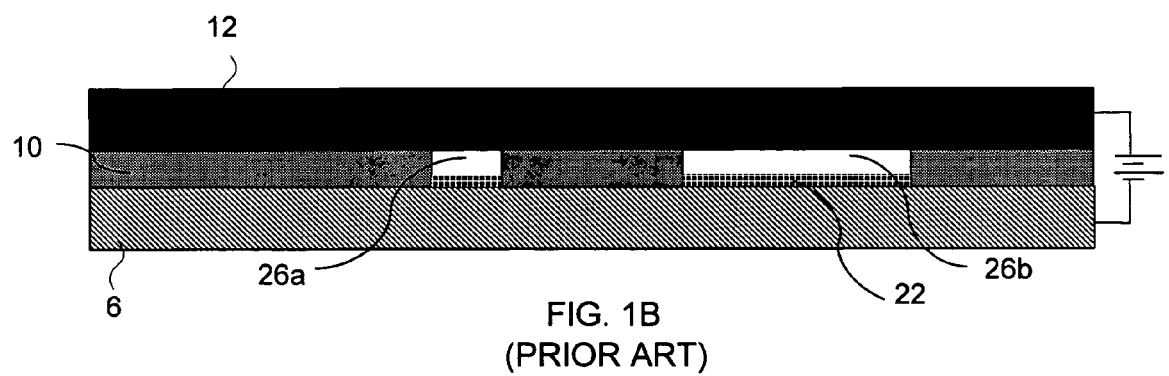
Figure 1C:
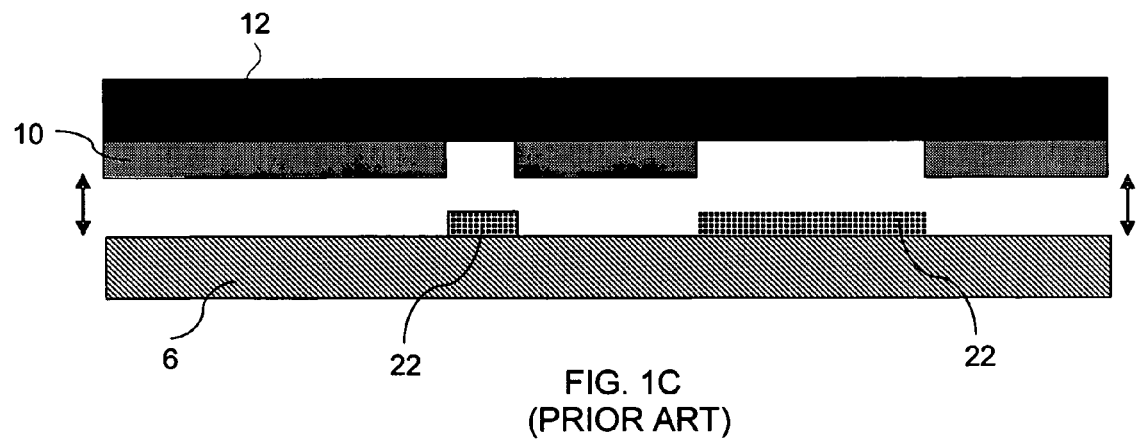
Figure 1D:
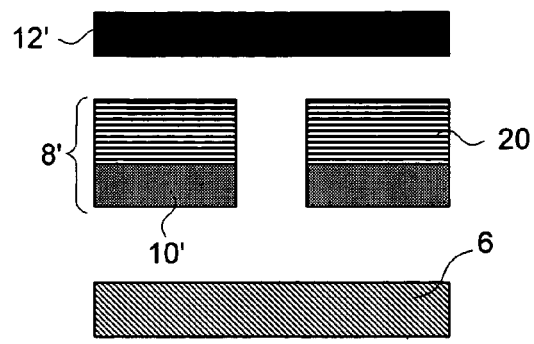
Figure 1E:
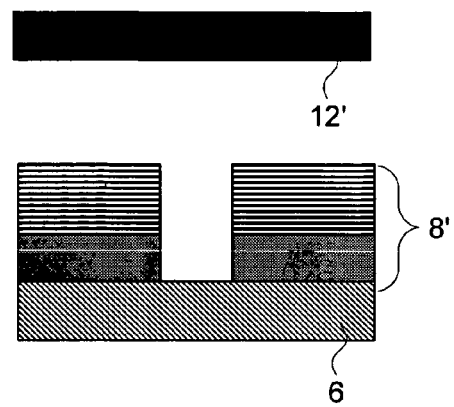
Figure 1F:
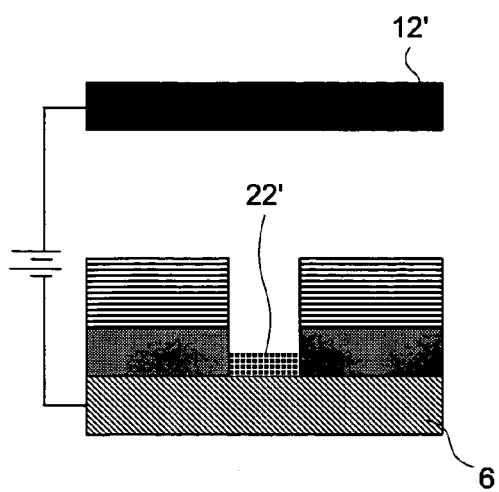
Figure 1G:
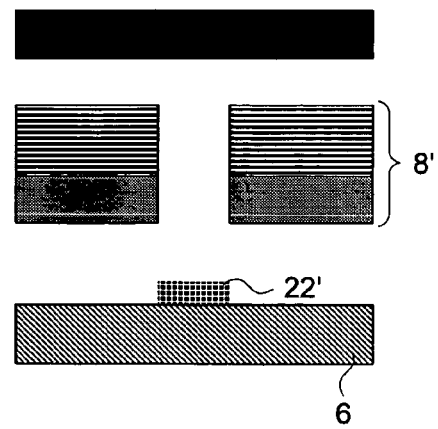
Figure 2A:
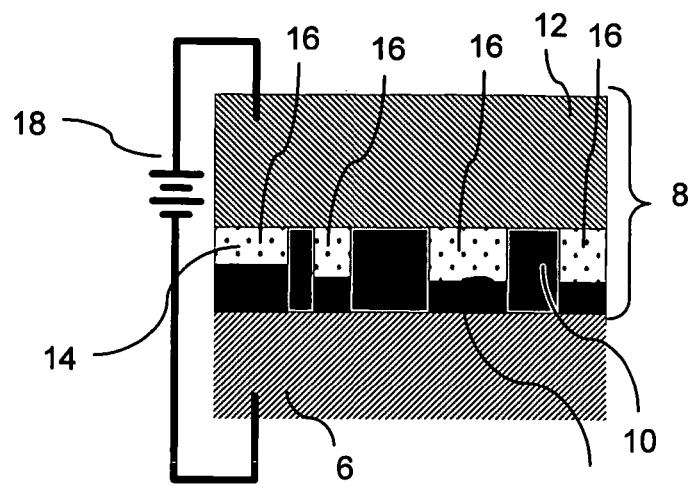
FIGS. 2A–2F schematically depict side views of various stages of an electrochemical fabrication process as applied to the formation of a particular structure where a sacrificial material is selectively deposited while a structural material is blanket deposited.
Figure 2B:
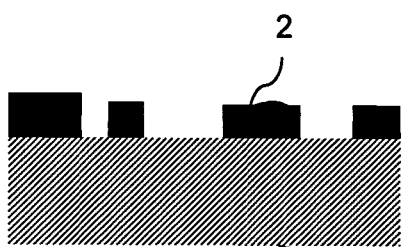
Figure 2C:
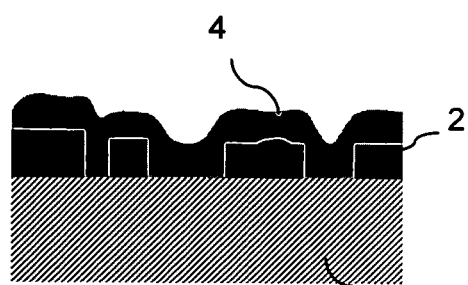
Figure 2D:
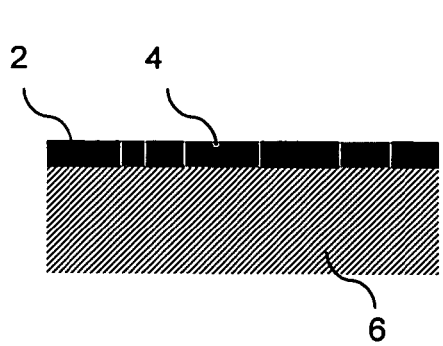
Figure 2E:
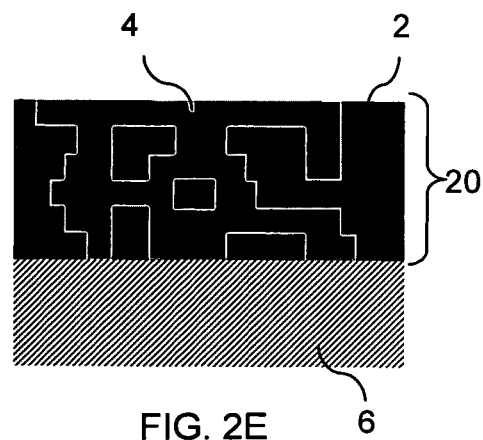
Figure 2F:
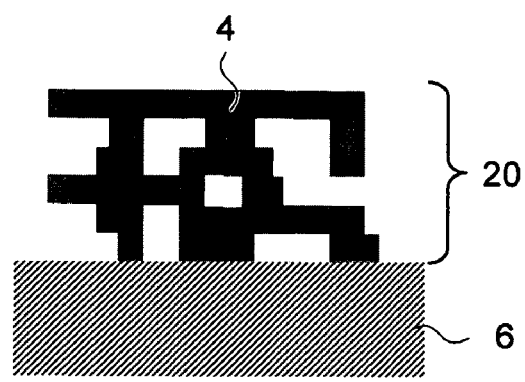
Figure 3A:
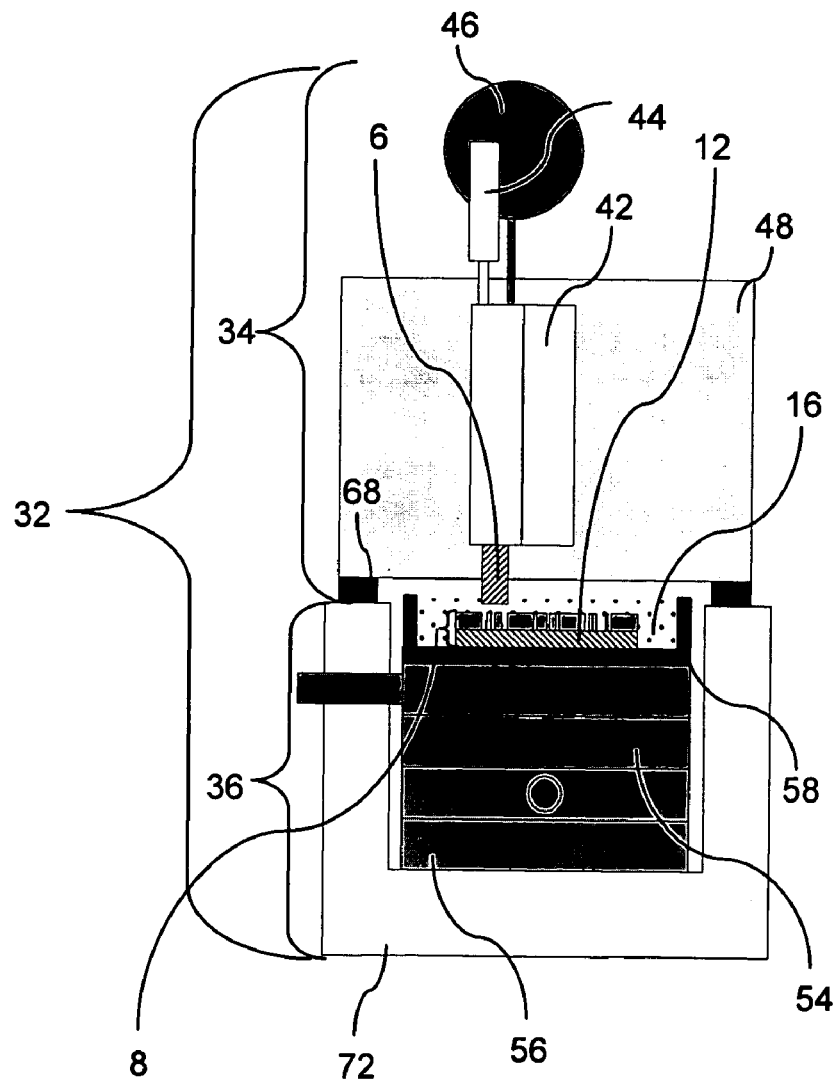
FIGS. 3A–3C schematically depict side views of various example subassemblies that may be used in manually implementing the electrochemical fabrication method depicted in FIGS. 2A–2F.
Figure 3B:
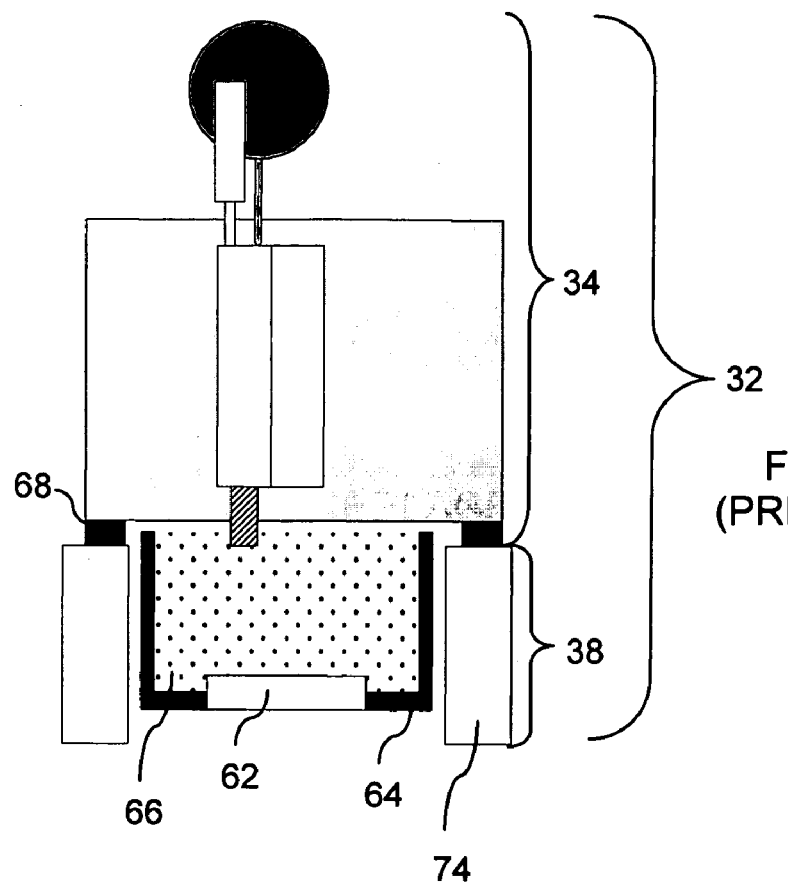
Figure 3C:
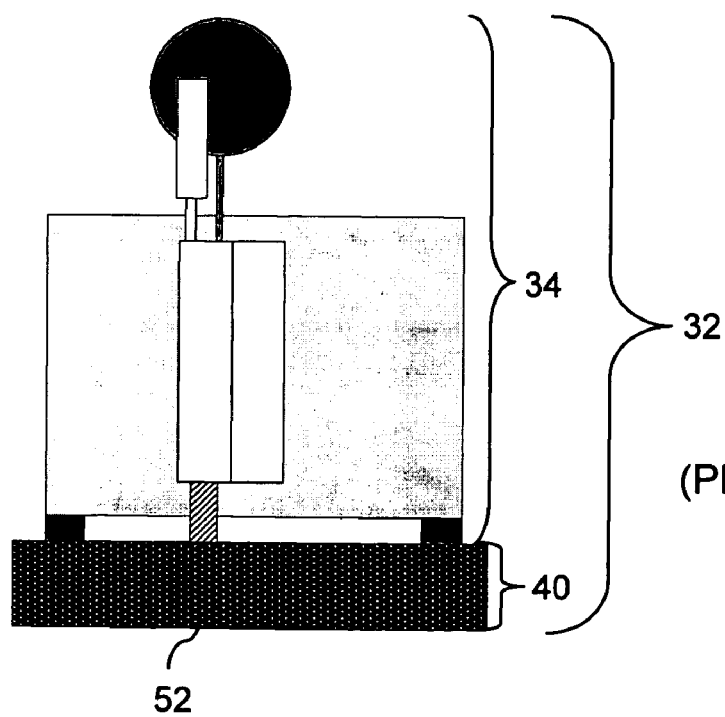
Figure 4A:
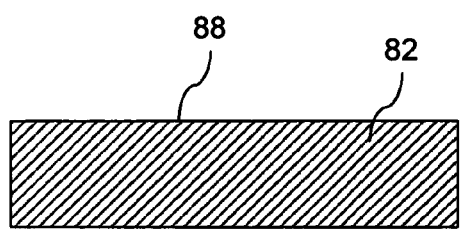
FIGS. 4A–4F schematically depict the formation of a first layer of a structure using adhered mask plating where the blanket deposition of a second material overlays both the openings between deposition locations of a first material and the first material itself
Figure 4B:
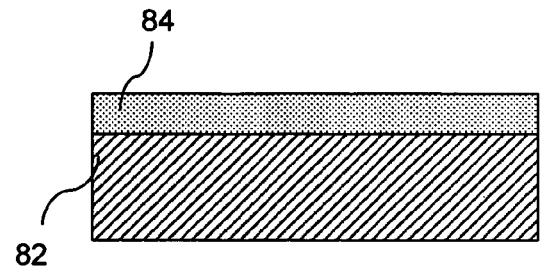
Figure 4C:
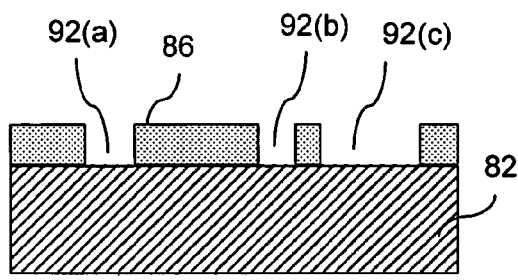
Figure 4D:
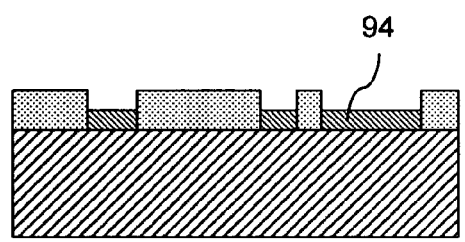
Figure 4E:
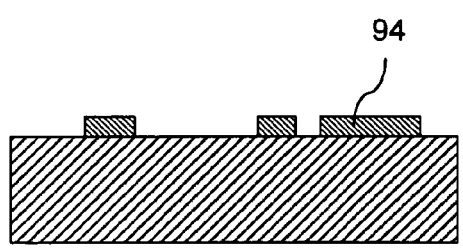
Figure 4F:
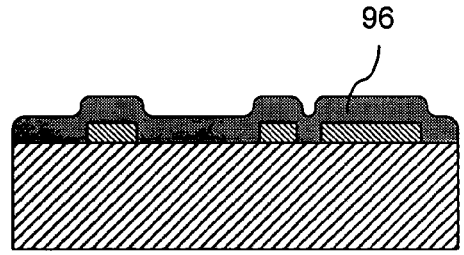
Figure 4G:
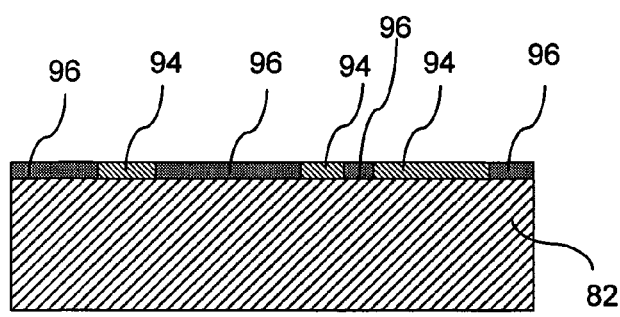
FIG. 4G depicts the completion of formation of the first layer resulting from planarizing the deposited materials to a desired level.
Figure 4H:
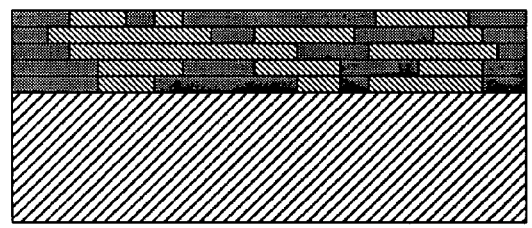
FIGS. 4H and 4I respectively depict the state of the process after formation of the multiple layers of the structure and after release of the structure from the sacrificial material.
Figure 4I:
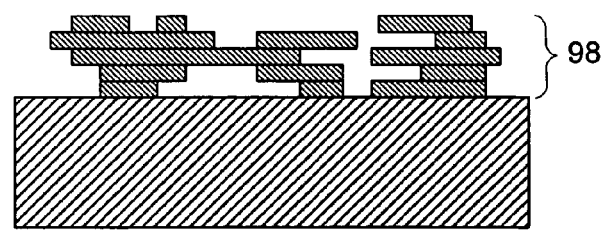

FIGS. 4A–4I illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)–92(c) extending from a surface 86 of the photoresist through the thickness of the photoresist to surface 88 of the substrate 82. In FIG. 4D a metal 94 (e.g. nickel) is shown as having been electroplated into the openings 92(*a*)–92(*c*). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B–4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be used in combination with electrochemical fabrication techniques that use different types of patterning masks and masking techniques or even techniques that perform direct selective depositions without the need for masking. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

Figure 5A:
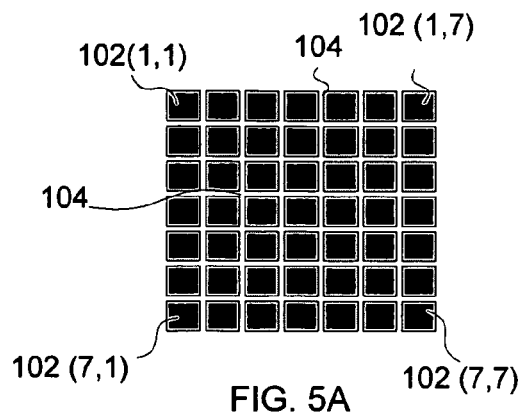
FIGS. 5A–5C depict top views of elements of one embodiment of a multi-cell mask.

A simple example of a controllable multi-cell mask and a sample deposition created therefrom is illustrated in FIGS. 5A–5F. Electrochemical Fabrication using such programmable multi-cell masks may be termed Direct-Write™ EFAB™ ". As the masks may be controlled to provide many different deposition patterns, they may be termed "smart masks". Utilization of smart masks eliminates the need for structure specific masks; however, in some embodiments a combination of smart masks and structure specific masks may be used as the structure or device specific masks may still offer some advantages in terms of surface resolution and smoothness. In some embodiments, a smart mask, may be based on a smart anode, which includes a plurality of individual subanodes 102(1,1) to 102(7,7), arranged in a 2-D matrix and separated by a dielectric 104. An example of such a multi-cell anode is depicted in FIG. 5A. Each subanode may be individually turned on and off. The control of the individual subanodes may be achieved, for example, by fabricating the array of subanodes over an integrated circuit, and using transistors in the circuit to control current to the subanodes. This can be done, for example, using flip-flops at each subanode location. The subanodes may be supported in position by other structures (not shown) which may, for example, include a solid dielectric material located between each subanode or connecting the back sides of each subanode.

Figure 5B:
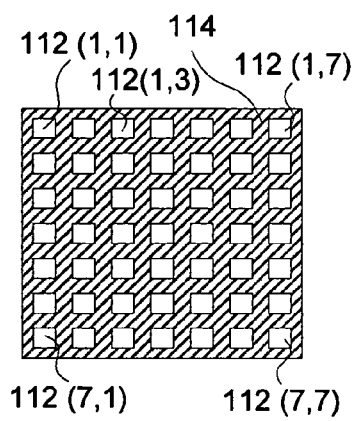
Figure 5C:
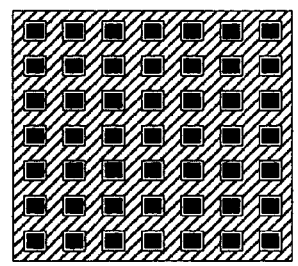

In some embodiments the array of subanodes is covered with a patterned elastomeric material that extends beyond the plane of the electrodes such that a pocket is formed around each anode having a width that establishes the effective size of the anode and a depth (e.g. as small as 10 microns, or less, to as large as one to several hundred microns, or even larger) appropriate for holding an electrolyte and allowing a desired electrochemical reaction to occur. The regions defined by the anode, the dielectric may be considered the cells of the mask, in this embodiment, and regions additionally defined by a substrate to which the mask is positioned in proximity to or brought into contact with, may be considered as process pockets associated with the cells of the mask Each anode may be formed of the desired material to be deposited (e.g. copper) or it may be formed of a non-erodable conductor (e.g. platinum or highly doped silicon) on which a quantity of deposition material is placed. A pattern of elastomeric material 114 is illustrated in FIG. 5B where openings 112(1,1) to 112(7,7) are formed which help define the cells of the mask. FIG. 5C illustrates the elastomeric material 114 overlaying the anodes 102(1,1) to 102(7,7). The type of smart mask illustrated in FIGS. 5A to 5C may be termed a "mask-on-anode" (MOA) mask for conformable contact masking or proximity masking.

In other embodiments, the elastomeric material may be replaced by a conformable material that is non-elastomeric or by even a material that is relatively rigid without significant conformability. In embodiments where a rigid contact material is used there may be an increased likelihood of flash which may be removed or reduced by application of a selective etching operation or by a relatively short or gentle bulk etching operation of the electrochemical or chemical type. In embodiments where a relatively rigid contact material is used, flexibility across the width of the mask may be obtained by a support structure, that connects some or all of the anodes together, having some flexibility or by a more conformable material being located between the anodes and the contact material. Such alternatives for providing overall flexibility to a mask that uses a relatively rigid contact material are further described in U.S. Provisional Application No. 60/429,484 filed Nov. 26, 2003 by Cohen et al, and entitled "Non-Conformable Masks and Methods and Apparatus for Forming Three-Dimensional Structures". This application is incorporated herein by reference.

In some embodiments, the mask may include a dielectric material that is disassociated from the rest of the mask (e.g. electrodes and separating dielectric). In these alternative embodiments the disassociated dielectric may be patterned onto a substrate or previously deposited material. It may be planed (if necessary, e.g. by machining or lapping) and patterned in a desired manner. The patterning of the disassociated dielectric material may define cells of similar resolution to that defined by the separate portion of the mask. Such embodiments may benefit from accurate placement of the disassociated masks but may not require as accurate a placement of the portion of the mask that contains the electrodes as slight misplacements of the two may have little negative impact on the deposited or etched material. Examples of materials that may be used to form such disassociated masks include liquid photoresists (of the negative or positive type), dry film photoresists (of the negative or positive type), and photopolymers. Patterning of such materials may occur via normal exposure through photomasks followed by development, direct scanned UV laser exposure followed by development, or even direct laser ablation. An advantage to such an approach is that a single photomask or a small set of photomasks may be used to produce a wide range of structures.

As noted above each anode of the smart mask is independently controlled. This may be achieved, for example, through its formation on an integrated circuit that offers control capability or through conductive paths that lead from the back side of the mask, or through the dielectric material located between the subanodes, to appropriate control circuitry. In still further alternatives, control may be provided via a reduced set of control lines via multiplexed configuration of control lines and circuitry. The multiplexer may power individual cells directly or it may supply power to storage capacitors, or the like, associated with each cell which in turn supplies a steadier level of current and/or potential to selected subanodes.

Figure 5D:
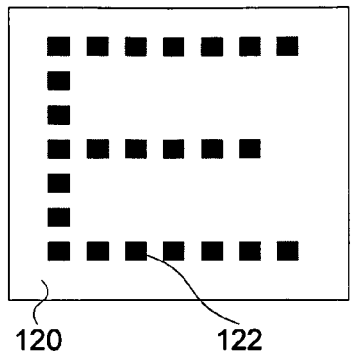
FIGS. 5D–5F depicts top views of the resulting depositions from a first selective activation of the mask, a combined first and shifted second activation and the result of four activations with the third and fourth being shifted relative to each other and to the first and second activations.
Figure 5E:
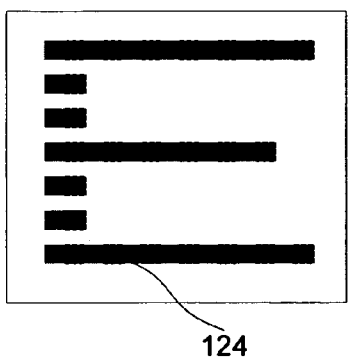
Figure 5F:
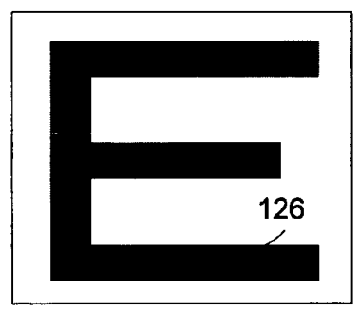

When the mask is pressed against a substrate and the subanodes are turned on in a specific pattern, a selective deposit of that pattern occurs. FIG. 5D illustrates an example of a selective deposit pattern 122 over a substrate 120 that forms a portion of a letter "E" pattern. By relatively shifting the substrate and mask positions to three additional offset positions and repeating the same deposition pattern, a completed pattern is deposited. FIG. 5E illustrates the deposition pattern 324 that results after the second positioning and deposition operation. FIG. 5F illustrates the completed pattern 126 after all four depositions.

In other embodiments, the offsetting and deposition patterns could have been performed using more than four sets of operations (e.g. positioning, seating, and deposition operations) and/or different deposition patterns could have been used after each positioning operation. If the required final deposition pattern allowed it, fewer than four sets of operations could have been performed. Deposits such as that in FIG. 5F, since they result from the overlap of individual patterns, are continuous in the substrate plane. However, because of the overlap, they are of non-uniform thickness (thicker in the area of overlap). The non-uniformity in thickness may be removed by a planarization operation (and potentially other clean up operations) either prior to the completion of all depositions for a given layer or after completion of all deposition for the layer (e.g. before or after a blanket or other deposition that deposits a final material for the layer).

In alternative embodiments, the subanode dimensions, the subanode spacing, and the positioning accuracy associated with the offsets may be selected such that little or no overlap occurs between successive depositions, i.e. between pattern filling depositions, associated with forming a given layer. In still further alternative embodiments, different smart masks having different deposition patterns or sizes may be used for successive (i.e. shifted) depositions such that overlap is minimized while still ensuring lateral contact between deposits.

Subanodes may be periodically "redressed" so that the mask can be used multiple times. In the case of a multi-cell mask that is used for deposition, redressing may occur by plating deposition material onto the subanodes. Prior to beginning a redressing operation, if the subanodes are formed of a non-erodable material (e.g. platinum or silicon), any remaining deposition material on the subanodes to be redressed can be removed and then redressing can begin with a known starting point. In some embodiments, the extended dielectric material is preferably not mounted to the erodable material but in other embodiments it may be. In some embodiments, the extended dielectric material is mounted to a second dielectric that separates the electrodes from another or alternatively is mounted to a combination of a second dielectric and a non-erodable conductive material where the depositable material is plated onto the non-erodable material within the cells defined by the extended dielectric material.

It can be determined which subanodes should be redressed, and potentially by how much, by simply tracking their deposit history individually. Alternatively, the subanodes may be tested periodically to ensure that they are working properly. For example, a test may be performed before a deposition onto a substrate and after a deposition onto the substrate. If the prior test showed that each subanode was working correctly, the subanode is used for the deposition onto the substrate. If after deposition, the subanodes are retested, and it is found that one or more of the anodes failed the test then selected depositions on the substrate can be examined for their appropriateness and/or the deposition on the substrate can be removed and the selectively deposition operation repeated with a different mask, with the same mask but after redressing, or deposition to only selected portions of the substrate can be repeated but this time using different cells of the mask.

Cells that remain defective, even after attempts to redress them, may be flagged and their use avoided during successive plating operations or otherwise compensated for by performing additional plating operations with offsets to position working cells to positions previously occupied by the faulty cells.

While the use of N exposures (e.g. 4 exposures) will result in an N-fold (e.g. fourfold), or more, increase in deposition time compared with EFAB using structure specific masks, overall process time may not increase by such a large factor as the process typically includes other operations as well. If the EFAB process is similar to that set forth in the background (i.e. with one blanket deposition operation and one planarization operation per layer), the overall process time, for example if four exposures are used will probably not double.

In preferred embodiments, the elastomer is thick and/or compliant enough that it can accommodate for the thickness of a deposit generated during a previous exposure (i.e. previous deposition) and still provide good masking with minimal and preferably no flash as the mask attempts to mate over any discontinuity between the deposit and the substrate below. To minimize the effects of large discontinuities, planarization operations can occur more frequently than once per layer.

In alternative embodiments, discontinuities may be minimized by only making partial layer thickness depositions per pass and then repeating the four or more steps a plurality of times (this may be termed "cycling"). It may be beneficial to implement cycling when layer thickness is above 1–2 microns such that the thickness added by any single deposition remains under about 1 micron.

In other alternative embodiments, instead of using the multi-cell mask to perform deposition operations, the multi-cell mask may be used to perform etching operations. In these alternatives, much of the above discussion still applies but the cells of the mask no-longer contains subanodes but instead may be considered to contain subcathodes. Such masks may be considered to be of the Mask-on-Cathode (MOC) type.

Differential in deposition height or etching depth from an active cell may occur due to differential amounts of time that different portions of the region are exposed to deposition or etching conditions. As a cell is shifted through its four or more deposition positions, if there is some overlap between the positions (e.g. near the center of the region) the overlapped regions will receive a different amount of deposition or etching than the non-overlapped regions. Differential in deposition may not matter in a build process that will include a planarization operation on each layer.

However, when planarization is not to occur on each layer, it may be desirable to even out the deposition thickness. This evening out may occur in a multi-cell selective deposition embodiment by etching with one or more additional multi-cell masks (e.g. a second mask and possibly a third mask or even a fourth multi-cell mask) where the cell patterns and positions of these patterns are set to correspond to the regions of overlap (e.g. quadruple overlap, double overlap, and the like). In embodiments where the resolution is considered to correspond to the approximate area that is to be covered by each cell (i.e. a given cell is either off or on for all exposures of a deposition and offsetting pattern), as the overlap positions associated with cells are dictated by the cell shape and the offsetting technique used, these overlap patterns will have fixed shapes that can be accommodated by only one or a few additional masks. For example if it is desired to bring the net deposition height down to approximately the deposition thickness associated with the non-overlapped region, then the quadruple overlap mask may be used to etch the quadruple exposed region down to the level of a double exposure, while the double overlap mask may include the quadruple overlap region and it may be used to reduce the thickness down to the non-overlap thickness.

Differentials in etching depth within a given cell's etching region may also be problematic and may require intervention using multi-cells masks having cell configurations that correspond to different etching overlap levels (quadruple overlap, double overlap, and like). These additional masks may be used to plate material into the over etched regions to bring the approximate level of the entire regions to the non-overlapped etching depth in a manner analogous to the way it was done for evening out deposition differentials.

Of course in alternative approaches, masks with patterns corresponding regions where non-maximal etching occurred or non-maximal deposition occurred (e.g. double deposition or etching as opposed to quadruple deposition or etching, and single deposition or etching as opposed to quadruple deposition or etching could be used to cause additional deposition or etching such that the amount deposited throughout the region would be equal to the maximum amount deposited or etched. This approach may not provide a saving in time but it may provide a savings in material consumption.

In still other embodiments, the width of the cells could be made to match the width of the regions separating the cells such that upon offsetting no overlap would occur. In still other embodiments it may be possible to use masks having effective deposition or etching widths that are slightly smaller than the offset used between depositions (e.g. the effective deposition width of a cell of the mask may be slightly less than one-half the width of the region to be deposited to by the cell) where it is anticipated that any gaps between the offset deposition regions will be filled in by as a result of the conformable contact material's inability to enter narrow deposition gaps such that material becomes deposited in to the gaps In still other embodiments MOA type masks and MOC type masks may be replaced with anodeless and cathodeless masks in that the anode and cathode (at least as far as plating or etching operations is concerned) is not located on or within each cell of the mask but instead is separate from them. Each cell will include a passage that will, under appropriate conditions, allow ion flow between the substrate and an anode or cathode that is remotely positioned (typically within a volume of electrolyte that is larger than the volume of electrolytes within the process pockets). Each cell will include at least one control electrode or other control element that can be effectively used to allow or inhibit passage of ions to or from the substrate and thus can be used to selectively control which cells allow deposition or etching and which cells do not.

In the some embodiments of the present invention it is important to understand that it may not be necessary to completely eliminate deposition or etching in regions protected by inactive cells (i.e. cells that are not supposed to allow deposition or etching) but instead it may only be necessary to create a sufficient deposition or etching differential (e.g. greater then 5 to 1, more preferably greater than 10 to 1 and most preferably greater than 20 to 1). If necessary, small amounts of deposition within inactive cell regions may be removed by performing a short or gentle etching operation either in a selective manner (e.g. material selectively or region selective, or both) or in a bulk manner. Etching may occur via either electrochemical etching or chemical etching.

If necessary, small amounts of etching from inactive regions may be neutralized via a planarization operation that removes material such that voids created by undesired etching are removed and thereafter additional deposition or etch steps can be continued. The planarization operation may be followed by a cleaning operation that ensures planarization debris is removed from the intended etching voids. As an alternative to planarization or as a complement thereto, a selective deposition operation can be performed using the multi-cell mask where a slight amount of deposition is made to occur within those inactive cells where the material that may have been inadvertently etched into is the same as the material that is being deposited.

In still further alternatives, if control of active and inactive cells is difficult, multi-cell masks that contain through passages and non-erodable electrodes may be used in a multi-operation process to perform selective deposition and/or etching. To perform a deposition operation from a remote source to the substrate, the following two operations may be performed:

1. Treating the remote source as an anode and the active cell electrodes as cathodes and proceeding with depositing material from the remote source on to the active cell electrodes. During this part of the operation the substrate would be left at a floating potential. The inactive cells may also be at a floating potential or at a potential equal to or greater than that of the remote source. During this process, it is preferred that the cell electrode within the inactive cell remain free of any deposition material.

2. Removing the potential from the remote source and letting it float or alternatively removing the remote source from the electrolyte. Treating the active cell electrodes as anodes and treating the substrate as a cathode. Allowing deposition to occur. During this operation the potential on the electrodes in the inactive cells is preferably the same as or greater than the potential on the active cells. Depending on the flow restrictions it may be possible for the potential on the inactive cells to remain floating. A flow restriction that would allow such a floating potential to be used may involve a second non-erodable electrode in each cell positioned to be further away from the substrate than the electrode that is actively involved in the operations. The potential on this second electrode would be higher than that on the other cell electrode such that it provides a barrier to positive ions leaving the cell. In a further alternative, the second electrode may be coated with a thin dielectric such that it cannot participate in charge transfer while still allowing it to participate in forming an electrostatic barrier. As necessary, the mask may be shifted to ensure deposition to all appropriate locations.

To perform an etching operation from the substrate to a remote material depository, two operations analogous to those set forth above may be used. For example, two such operations might include:

1. Treating the substrate as an anode and the active cell electrodes as cathodes and proceed with etching material from the substrate and depositing it on to the active cell electrodes. During this part of the operation the remote depository is left at a floating potential or even removed from the bath of electrolyte. The inactive cells are held at the substrate potential or somewhat higher and they are preferably free of any erodable material. In an alternative embodiment the cell electrodes in the inactive cells are allowed to float but a second set of possibly insulated electrodes in the inactive cells may be set at a potential equal to or greater than that of the substrate. As necessary the mask may be shifted relative to the substrate to ensure etching of all appropriate locations.

2. Removing the potential from the substrate and letting it float. Treating the active cell electrodes as anodes and treating the remote depository as a cathode. Allowing deposition from the active cell electrodes to the depository to occur. The inactive cell electrodes may be left floating or may be powered at the same potential as the active cell electrodes.

Figure 6A:
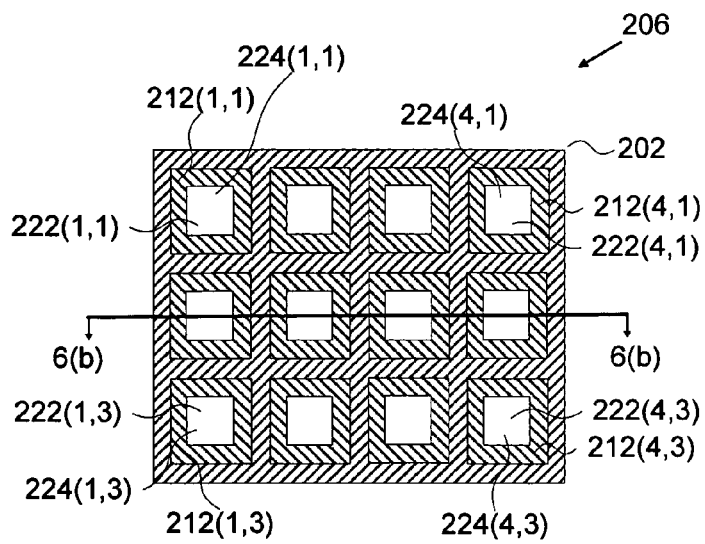
Figure 6B:
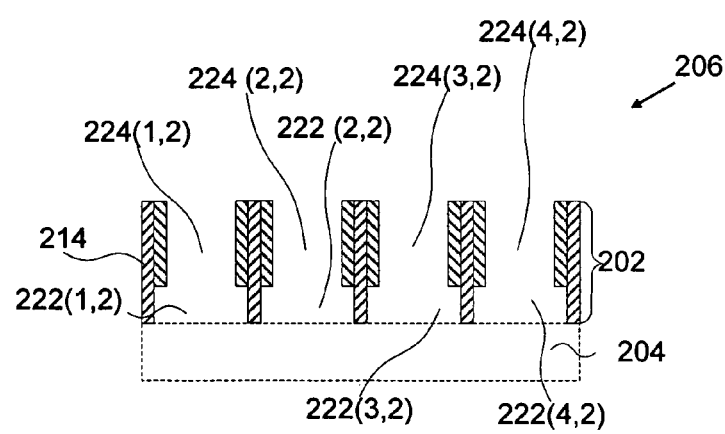
FIG. 6B depicts a side view of the mask of FIG. 6A.

FIGS. 6A–6B depict a top view and a side view, respectively, of an anodeless multi-cell mask 202 that may be used for deposition to or etching from a substrate 204. The mask consists of a grid 206 of a dielectric material 214 having a surface that is to contact or be located in proximity to a substrate 204. The dielectric material also supports cell electrodes 212(1,1) to 212(4,3) which form rings around pockets 222(1,1) to 222(4,3) and which have passages 224(1,1) to 224(4,3) that allow ion transfer from the substrate 214 to a region outside the mask 202.

When used herein, located "in proximity to" or being "proximate to" when referring to relative locations of a mask and a substrate shall be construed to mean close enough spaced such that deposition or etching from one cell has minimal, or certainly no more than an acceptable amount of deposition to or etching from the regions associated with neighboring cells. If etching operations, or planarization operations are used to minimize the effects of undesired deposits or voids created by etching of undesired regions, the extent of what is considered to be acceptable amounts of peripheral deposition or etching may be increased.

Figure 6C:
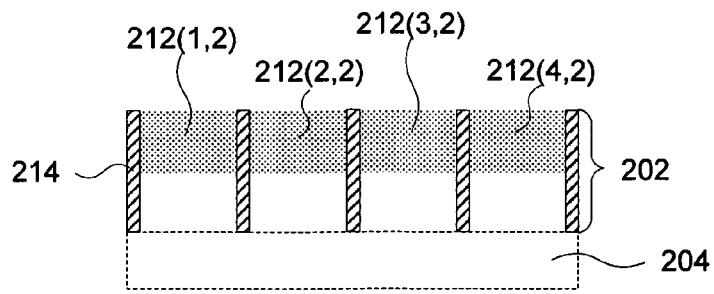
FIG. 6C depicts a side view of a mask similar to that of 6A and 6B but with a cell electrode in the form of a porous medium.

In alternative embodiments a rigid dielectric material may be used to support the cell electrodes while more conformable or even an elastomeric dielectric may be used for contacting the substrate. In further alternative embodiments the cells may include more than one electrode wherein one or more of the electrodes are insulated by a dielectric material (e.g. a thin coating of dielectric). In still further alternative embodiments, the cell electrodes can have appendages and or crisscross grids of elements that extend into or even completely across the passages 224. The appendages or electrode grids may be exposed to electrolyte and thus be able to directly receive and or give up material or they may be coated with dielectrics. In still further alternative embodiments some or all of the cell electrodes may take the form of porous conductive structures 212'(1, 2)–212'(4,2) as shown in FIG. 6C. In still further embodiments, the cell electrodes need not be located at an end of the passages.

Figure 7:
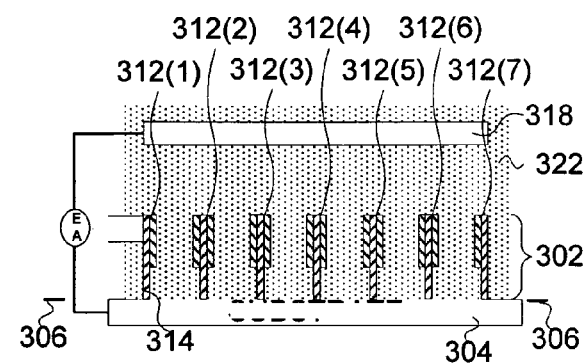
FIG. 7 depicts a side view of a multi-cell mask having passages that extend through the cells and cell electrodes in the form of rings that surround the passages along with other components that would be used in practicing an embodiment of the invention.

FIG. 7 depicts a schematic representation of a plating system that uses a multi-cell mask 302 which is similar to the mask of FIG. 6B but shown as have 6 cells. The mask 302 is immersed in an electrolyte 322 and is shown has having ends of dielectric 314 contacting a substrate 304 along a surface 306. The multi-cell mask includes individual ring like cell electrodes 312(1)–312(6). The substrate 304 is connected to an anode 318 via a source of electric activation EA. EA is a source of electric power (e.g. a substantially constant current source). Whether element 318 represents a source of ions or a depository for ions depends on the polarity of the potential supplied by EA. If EA is more positive on element 318 (anode), then deposition to the substrate 304 (cathode) will occur while if the potential is more positive on the substrate 304 (functioning as an anode) then etching of the substrate will occur and deposition to element 318 will occur.

References V1–V6 indicate that each cell electrode may take an independent potentials or at least potentials that are selected between two or more values. The potential selected for each cell electrode determines whether the cell is active (allows deposition or etching) or is inactive (inhibits deposition or etching). EA and Vi may be looked at in different ways: (1) fixed voltages or voltage differentials or (2) simply as potentials that give current flow a particular direction and whose magnitude is only relevant relative to other elements in the electric path.

For deposition (e.g. electroplating) to occur onto the substrate for selected cells, the ion source will function as an anode (+ potential) and the substrate will act as a cathode (− potential). Active cells (i.e. the cells that allow deposition) may be allowed to have floating potential (i.e. no potential that is fixedly maintained) though in some embodiments they may be given a potential somewhere in between that of the anode and that of the cathode. The inactive cells (i.e. the cells which will inhibit plating) preferably have a potential at least as large as that of the ion source and maybe even somewhat higher. Since the cell electrode for the inactive cells presents a higher potential than the ion source, ions will be inhibited from entering the cells. Thus significant plating on the portion of the substrate bounded by the cell is inhibited. Preferably the cell electrodes are of a non-erodable material such as platinum or silicon but an erodable material may be acceptable if the potential differences are such that significant erosion doesn't occur or current densities are such that significant plating onto the substrate doesn't occur. In some alternative embodiments where the cell electrodes are used solely for creating appropriate electrical potentials (as in the present embodiment) and do not participate in current carrying functions of the system, the cell electrodes may be isolated from the electrolyte (e.g. plating solution) by a dielectric material.

For electrochemical etching, element 318, the depository, functions as a cathode (− potential) while the substrate functions as an anode (+ potential). The active cell electrodes preferably have floating potentials though in some embodiments it may be possible to set their potentials at something intermediate to the cathode and anode potentials. Inactive cell electrodes preferably have a potential as great as that of the substrate or more preferably somewhat greater.

In plating embodiments, the space within the cells is filled an electrolyte 322 that extends from the cathode (i.e. substrate) to the anode (i.e. the ion source). In etching embodiments, the cells are filled with an electrolyte that may also function as a plating solution. In some embodiments the same mask and plating solution may be used for both plating and etching operations by reversing the polarities of the various electrodes.

The system of FIG. 7 may be used in a manner as described above, in a manner described elsewhere herein, or in a manner that will be apparent from the teachings herein to those of skill in the art. Furthermore, the implementation details may be varied and optimized via use of ordinary skill.

As plating with the masks discussed above may result in some deposition into the inactive cells it is probable that after selective deposition an electrochemical bulk or selective etch (e.g. via the same multi-cell mask) could be performed for a limited time to remove any unwanted deposits while not significantly damaging the original depositions. A bulk or selective chemical etch could also be performed.

In the case of bulk etching for cleaning up of unwanted depositions, the original selective deposition data could be modified to accommodate for any XY shrinkage of the selectively deposited material.

FIGS. 5A–5F illustrate the use of a smart mask having a square pattern of subanodes lined up in rows and columns while FIGS. 6A–6C and FIG. 7 illustrate a mask with passages and effective deposition regions in the form of squares lined up in rows and columns. In other embodiments, other smart mask opening and deposition patterns are possible.

Figure 8A:
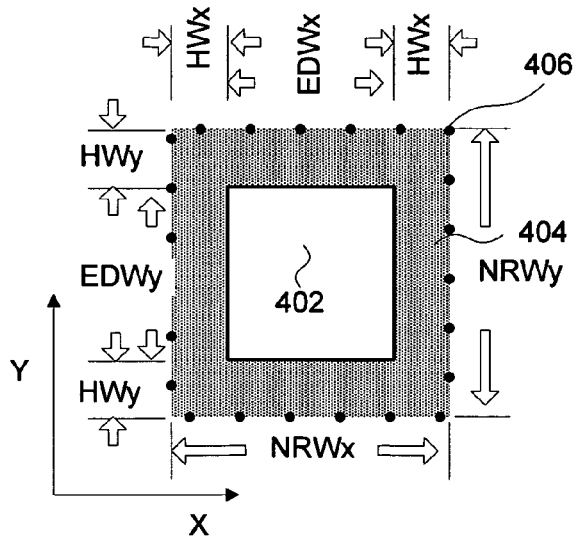
FIGS. 8A–8B depict a single cell of a multi-cell mask and multiple cells of such a mask, respectively, where the openings of the cells have a width that is large than the width of the dielectric that separates them.
Figure 8B:
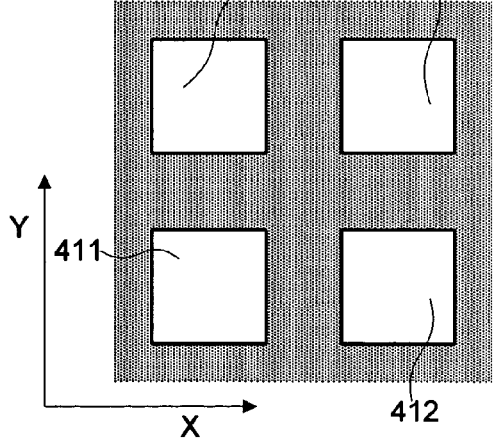

FIG. 8A also depicts a bottom view of one cell of a single cell mask or of a multi-cell mask illustrating an effective deposition region 402 associated with the cell, the portion of the dielectric material 404 (e.g. conformable material) associated with the cell material, and region boundary 406 illustrating the size of the region that should be effectively covered by the cell when part of a multi-cell mask performing deposition or etching operations. FIG. 8A depicts a number of dimensions associated with the region of the cell: (1) EDWx is the Effective Deposition Width of the cell along an X axis, (2) NRWx is the Nominal Region Width along the X axis; (3) HWx is the Half-width of the dielectric along the X axis on each side of the effective deposition region 402 of the cell; (4) EDWy is the Effective Deposition Width along a Y axis; (5) NRWy is a Nominal Region Width in Y axis; and (6) HWy is the Half-width of the dielectric along the Y axis. FIG. 8B illustrates a portion of a mask containing four cells 411–414 where the dimensions of the regions are similar to those depicted in FIG. 8A. The cells of FIGS. 8A and 8B may be used in depositing material in many different ways. Two examples of such deposition patterns are shown in FIG. 9A and FIG. 9B.

Figure 9A:
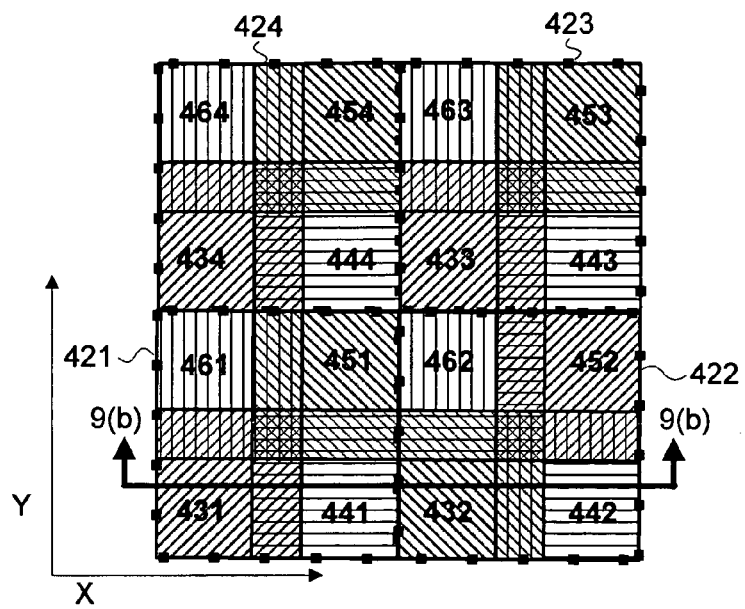
FIGS. 9A–9B depict top and side views, respectively, of an intra-region pattern of overlapping depositions.
Figure 9B:

FIG. 9A illustrates a four step deposition pattern using the four cell mask portion of FIG. 8B where each cell is active for each deposition to illustrate that in an embodiment based on this pattern, the deposition associated with any cell doesn't extend beyond its nominal region boundary. The region boundary for each of the four cells is illustrated by dotted boundaries 421–424. The initial depositions made by each of cells 411–414 are illustrated with reference numerals 431–434, while the second, third and fourth depositions are illustrated with numerals 441–444, 451–454, and 461–464. Within the deposition region for each cell overlapping depositions are shown to have occurred where the effective deposition regions overlapped as a result of successive depositions. In the implementation of FIG. 9A, the overlapping depositions only exist within individual boundary regions. This is more clearly illustrated in FIG. 9B where a side view along lines 9b—9b of FIG. 9A is shown where a larger deposition height is shown in the region of overlap. The depositions of FIG. 9A may be achieved via the four step offset pattern set forth in TABLE 1.

TABLE 1

| Depositions | Offset to Next Deposition |
|---|---|
| 431–434 | +2 * HWx |
| 441–444 | +2 * HWy |
| 451–454 | −2 * HWx |
| 461–464 | −2 * HWy (e.g. in preparation for depositions for 431–434 for a next layer or a next pass on the present layer) |

In other words, if the X and Y half widths are equal, then the offsets between depositions are +/−2*HW (i.e. or plus or minus the width of the dielectric between cell openings, W=Wx=Wy) along one or both of the axes. To achieve the same deposition pattern these offsets may be taken any order and even combined. Besides changing the order of depositions and thus changing the offsetting pattern, other offset patterns may be used. For example, similar deposition patterns may be obtained by using different cells to deposit to the different parts of a given region. Such a mixed cell deposition pattern may be obtained by shifting cells along one or both axes by one or more region widths (2*HWx+ EDWx in X or 2*HWy+EDWy in Y) and adding or subtracting the dielectric width (2*HWx in X or 2*HWy). In other words, the offsets may be $$N*(2*HWx+EDWx)+/-2*HWx \text{ in } X$$

and/or $$N*(2*HWy+EDWy)+/-2*HWy \text{ in } Y.$$

Figure 9C:
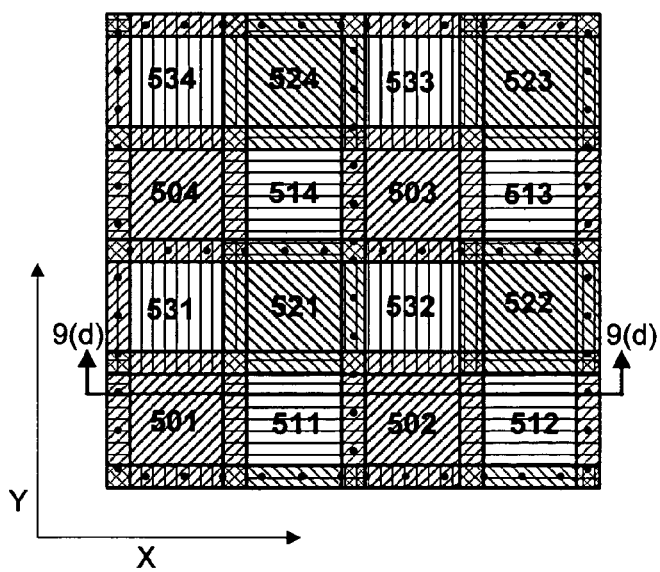
FIGS. 9C and 9D depict top and side views, respectively, of an inter-region and intra-region pattern of overlapping depositions.

FIG. 9C depicts a second example of a deposition pattern that might be achieved using offsets to ensure the potential for deposition to all portions of all regions. The resulting depositions, according to this pattern, include not just intraregion overlaps but also interregion overlaps. In this example where all masks are used at each deposit location, each deposition is overlapped on its edges by neighboring depositions. The first deposition of the pattern deposits regions 501–504, the second deposition deposits regions 511–514, the third deposition deposits regions 521–524, and the fourth deposition deposits regions 531–534. The overlapped edge depositions are shown under the assumption that such depositions would have been made by additional cells that would form part of the mask. As can be seen, a portion of the deposits associated with one cell overlay the region associated with a neighboring cell (e.g. deposits 511 and 521 from cell 411 overlay a portion of the region associated with cell 412 and similarly a portion of the deposits for 502 and 532 overlay the region associated with cell 411. This type of deposition pattern provides less intra-region overlap by providing some intra-cell overlap. This technique results in a loss of resolution (related to the amount of inter-region overlap but may ensure better region to region mating. As with the excess depositions associated with FIG. 9A, the excess deposition of material associated in FIG. 9C may be trimmed away by a planarization operation (e.g. lapping).

Figure 9D:

FIG. 9D depicts a side view of the depositions along lines 9(d)—9(d) of FIG. 9C. These lines show a larger deposition height in the region of overlap and that the overlap is narrower than that shown in FIG. 9B. In this example the offsets between successive depositions may take the form indicated in TABLE 2.

TABLE 2

| Depositions | Offset to Next Deposition |
| --- | --- |
| 501–504 | +2*[1/2 *(1/2 EDWx + HWx] = 1/2 *EDWx + HWx |
| 511–514 | +1/2 * EDWy + HWy |
| 521–524 | −(1/2 *EDWx + HWx) |
| 531–534 | −(1/2 * EDWy + HWy) |

In other embodiments, other offsets may be used while still achieving both intra-cell and inter-cell overlap. For example, individual cells may be used in depositing material to other cell regions by adding to or subtracting from the increments set forth above by an integral number of widths of the entire region (i.e. "EDWx+2*HWx" along the X axis or "EDWy+2*Hwy" along the Y axis).

FIGS. 10A–10C depict a third example of a deposition pattern. In some embodiments the deposition pattern of FIGS. 10B–10C may be preferred in that less deposition overlap occurs and it may be possible to spend less time trimming down the deposit. It may also be preferred in that it offers enhanced resolution for a given sized Effective Deposition Width (EDW) for each cell. FIG. 10A depicts the region associated with a single cell of a multi-cell mask. In this example, the effective deposition width (EDWx and EDWy) are equal to twice the respective half-widths of the dielectric material (i.e. 2*HWx and 2*HWy, respectively). In this example, the offsets are selected such that adjacent deposits contact one another but do not overlap. Deposition begins with each of the four cells depositing material to their respective locations so that deposits 551–554 are made. The mask is then offset and depositions 561–564 are made. The mask is offset again and depositions 571–574 are made. Another offset is performed and deposits 581–584 are made. Additional offsets and depositions may be made if it is desired to build up deposition height).

FIG. 10C depicts a side view of deposits 551, 561, 552 and 562 along lines 10c of FIG. 10B.

In practice, this type of non-overlapping deposition pattern may be used where the resolution is defined as being related to the region size or to the EDW for each cell. If the resolution is to be related to the region size, then during deposition individual cells may receive an active or inactive command that would apply to each deposition in the pattern, whereas if the EDW is to dictate the resolution the active or inactive status of each cell would need to be updated for each deposition operation depending on whether the next deposition location is receive a deposit or not.

Other non-overlapping deposition embodiments are possible where the nominal region width (NRW) is an integral multiple of the EDW. These other embodiments may use more than two depositions locations for each cell along the X and/or the Y axes such that the number of depositions to complete a layer increases beyond 4 (e.g. 6 for a 3×2 region, or 9 for a 3×3 region).

Still other non-overlapping deposition embodiments may use an NRW that is somewhat larger than an integral multiple of the EDW. Embodiments of this type might be more preferable in some circumstances as they may be able to avoid unintended overlaps in deposits that might result from tolerances in EDW or NRW sizing or tolerances in positioning resolution. If the widths of the openings in the mask are just slightly smaller than the width of the dielectric material that separates the openings, it is believed imperfect conformability of the dielectric will inhibit the dielectric from completely closing the small gap between a region to be deposited. This inability to completely close the gap will result in the previous and current depositions contacting one another. This is illustrated in FIGS. 11A–11G.

Figure 11A:
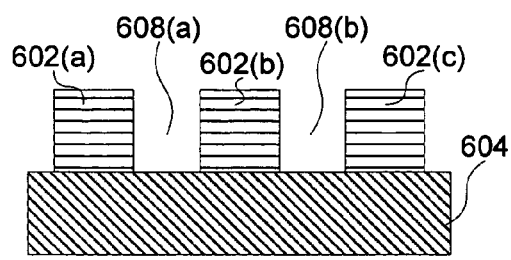
FIGS. 11A–11G provide an example of how cell opening slightly smaller than the dielectric spacing between openings may be used to form depositions without overlapping depositions or breaks between adjacent depositions.
Figure 11B:
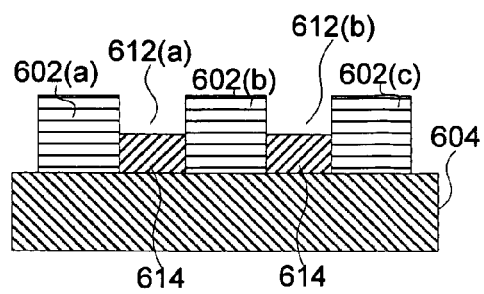
Figure 11C:
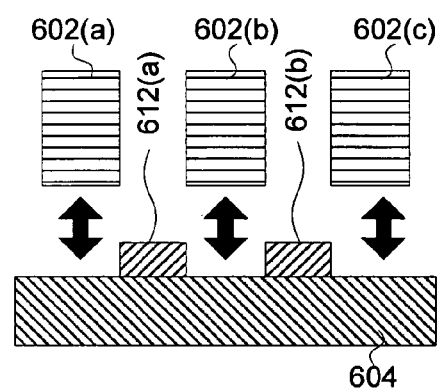
Figure 11D:
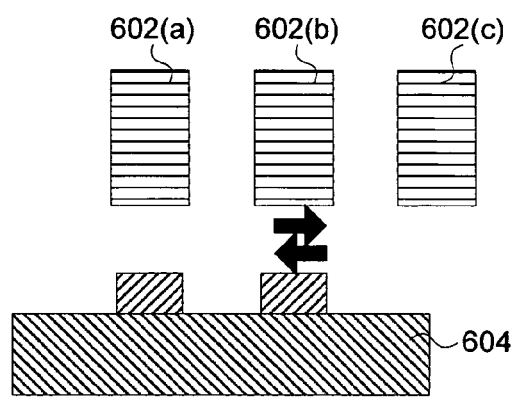
Figure 11E:
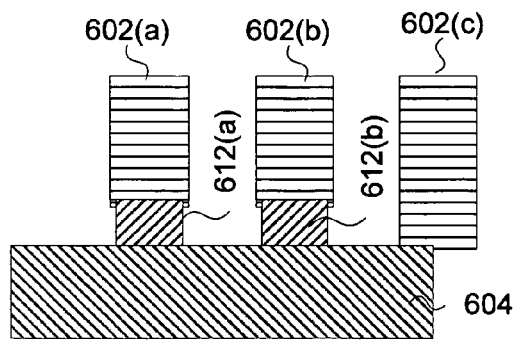
Figure 11F:
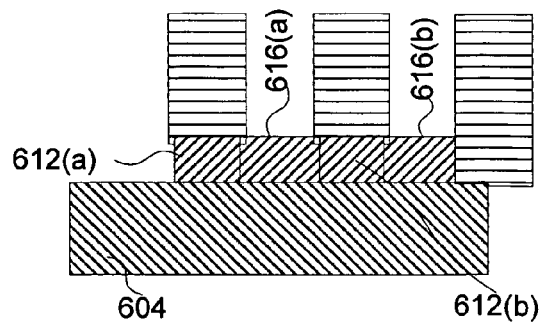
Figure 11G:
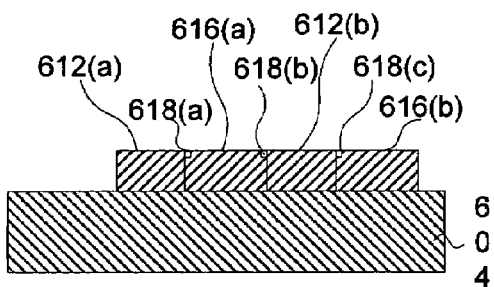

FIG. 11A depicts a side view of the partially conformable contact material 602(a)–602(c) of a mask contacting a substrate 604 where the conformable contact material defines two cells 608(a) and 608(b). FIG. 11B depicts the mask being used in making a first deposit 612(a) and 612(b) of material 614 onto the substrate. FIG. 11C depicts the mask being lifted from the substrate and the deposit while FIG. 11D depicts the mask being shifted to the right relative to the substrate and deposit. FIG. 11E depicts the contact material 602(a) and 602(b) pressed against deposit 612(a) and 612(b) respectively, and contact material 602(c) pressed against substrate 604. FIG. 11F depicts the depositions 616(a) and 616(b) that occur when the mask and substrate are pressed together in the indicated positions. FIG. 11G depicts the resulting depositions after removal of the mask. As can be seen the deposit includes indentations 618(a)–618(c) where the conformable material extended beyond the first depositions 612(a) and 612(b) and extended into the regions to receive depositions 616(a) and 616(b). If desired, these indentations may be removed by planarizing the surface of deposits and as such any negative impact associated with the formation of such indentations can be eliminated by making the initial deposits a little thicker than desired for the final layer thickness.

Figure 12A:
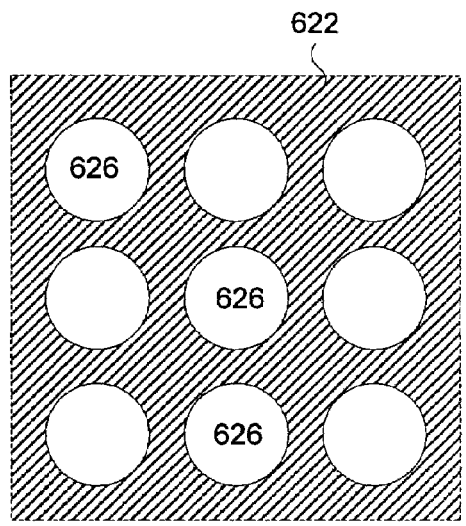
FIGS. 12A–12F depict some alternative opening configurations and patterns for masks.
Figure 12B:
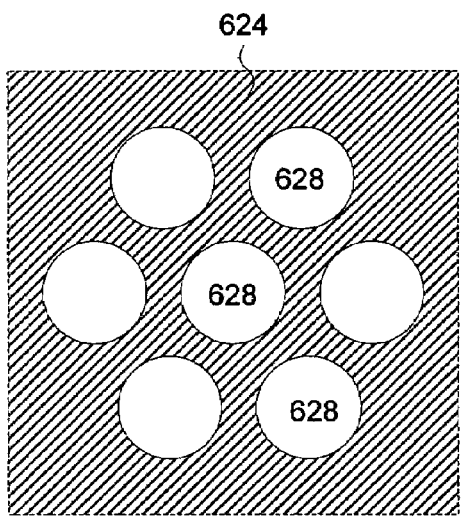

As noted elsewhere herein, in other embodiments, the shape of the cells may take other forms and/or the pattern of the cells may take other forms. Examples of such shapes and patterns are illustrated in FIGS. 12A–12D. FIGS. 12A and 12B depict patterns where circular cell configurations 626 and 628 (i.e. effective deposition areas) are formed within the dielectric materials 622 and 624, respectively. In FIG. 12A the circular cell configurations are laid out in a rectangular grid while in FIG. 12B they are laid out in a hexagonal pattern. These configurations may require use of higher numbers of shifting and deposition operations but they can result in final deposition patterns with potentially less "pixel-to-pixel" discontinuity (i.e. they can result in less of a horizontal stair stepping effect). Rectangular or square cell configurations can also result in smaller stair step patterns if they are made smaller or if smaller shifting steps are used in combination with more and perhaps shallower deposition operations.

Figure 12C:
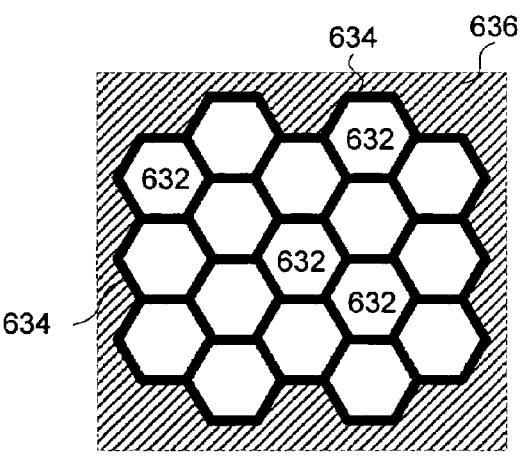

FIG. 12C depicts hexagonal shaped cell configurations 632 separated by relatively narrow dielectric boundary regions 634 which is supported by a base 636. With this pattern of subanodes a three-step deposition and offsetting pattern may be used to achieve complete deposition as will be discussed herein latter.

Figure 12D:
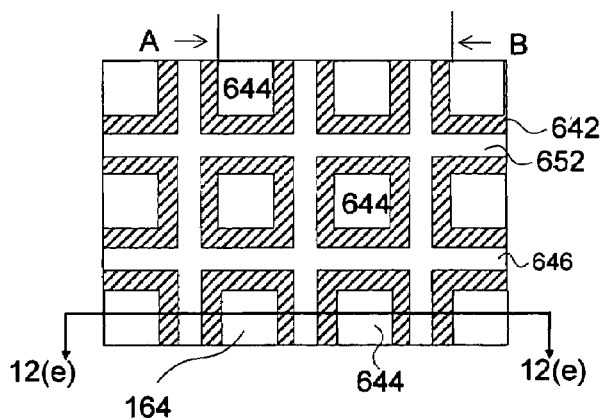
Figure 12E:
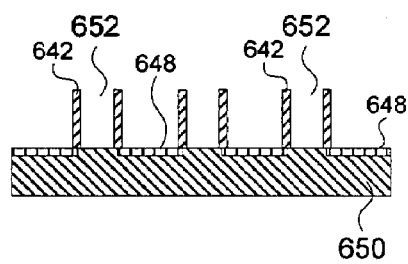

FIG. 12D illustrates a top view of an up-facing rectangular grid of square cell configurations with each having a width "A" and with each spaced from one another by a width "B" wherein the widths "A" and "B" are substantially equal or where "B" is slightly larger than "A" as was the case in FIGS. 10A–C and 11A–G. However, in this embodiment the contacting dielectric material 642 (i.e. the dielectric that can contact the substrate) does not extend completely between the cell openings 644 but instead forms isolated square rings around the individual cell openings with a gap 652 between each ring in which a recessed dielectric 646 is located. A side view of the mask along lines 12(e)—12(e) of FIG. 12D is shown in FIG. 12E in which individual electrodes 648 can be seen to be located within the individual cell openings and which are supported by a base 650. In FIG. 12E, the electric connections for the individual electrodes are not shown. The gaps 652 between the dielectrics 642 around each cell opening may provide more independent sealing when contract between the mask and a substrate is made.

Figure 12F:
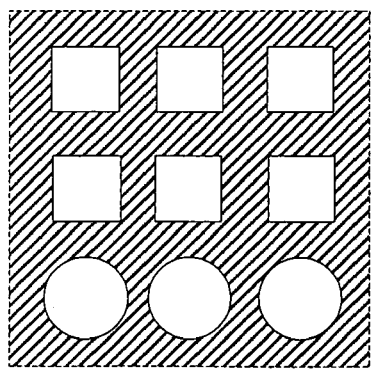

FIG. 12F depicts a top view of an alternative type of multi-cell mask where multiple cells configurations are provided. In this example, square cells and circular cells are provided. The square cells may be normally used while the circular cells could be used for regions where a particularly smooth transition is required or desired.

Figure 13B:
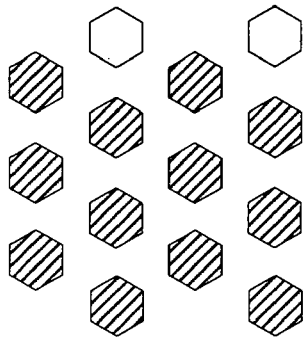
FIGS. 13A–13E depict a mask containing hexagonal openings spaced in a hexagonal pattern of approximately the same dimensions as the openings and an associated three-step non-overlapping deposition pattern that may be used with the mask.
Figure 13E:
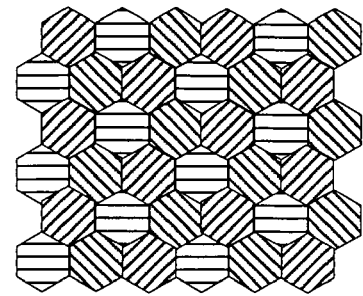
Figure 13A:
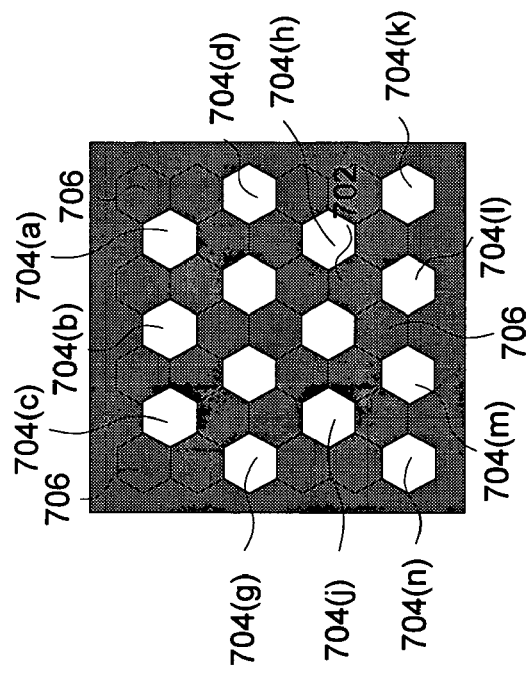
Figure 13D:
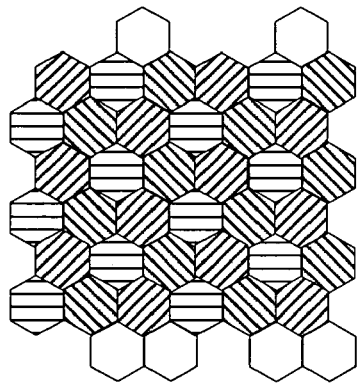
Figure 13C:
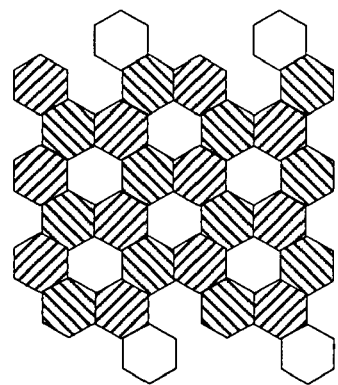

FIG. 13A depicts an alternative mask configuration 702 based on hexagonal openings 704(a)–704(m) that are spaced from one another by a region of dielectric material that has a configuration made up of hexagonal shapes 706. This pattern of openings and dielectric may be used to form selective patterns of deposition in a three step set of deposition and shifting operations as illustrated in FIGS. 13B–13D. FIG. 13B depicts a top view of the deposition pattern that results from using the mask pattern of FIG. 13A where all cells but those associated with openings 704(k) and 704(d) are active. The cells associated with openings 704(k) and 704(d) are not active in this example as the pattern to be deposited doesn't require depositions from these cells during this first deposition position. FIG. 13C shows the result of the first and second depositions with the second deposition offset from the location of the first deposition where all of the cells except those associated with openings 704(m) and 704(g) are active. As with FIG. 13B the outline of the regions not deposited to by the inactive cells are shown but without any filling pattern. FIG. 13D shows the result of the first through third depositions with the third deposition offset from the locations of both the first and second depositions. During the third deposition all of the cells except those associated with openings 704(n) and 704(g) are active. As with FIGS. 13B and 13C, the outline of the regions not deposited to by the inactive cells are shown but without any filling pattern. FIG. 13E illustrates the net result of the three depositions without any indication of the locations of the non-deposition positions. As can be seen, a three step deposition pattern can be used to fill the entire region. Other patterns of selective deposition could be obtained using this embodiment by selectively controlling the activities of the cells associated with openings 704(a)–704(n) during the series of depositions.

FIG. 14A depicts an alternative mask configuration 712 based on square openings 714(a)–714(i) that are spaced from one another by a region of dielectric material that has a configuration made up of square shapes 706. The configuration of these openings is such that the spacing between openings within a column is equivalent to twice the opening height while the openings within adjacent columns are located in line with the midpoint of the dielectric in the adjacent columns. This configuration allows the formation of straight lines in lines parallel to the columns (i.e. the y-direction) but not along lines in the perpendicular direction (i.e. the x-direction). This pattern of openings and dielectric may be used to form selective patterns of deposition in a three step deposition and shifting set of operations as illustrated in FIGS. 14B–14D. FIG. 14B depicts a top view of the deposition pattern that results from using the mask pattern of FIG. 14A where all cells but those associated with openings 714(h) and 714(i) are active. The cells associated with openings 714(h) and 714(i) are not active in this example as the pattern to be deposited doesn't require depositions from these cells during this first deposition position. FIG. 14C shows the result of the first and second depositions with the second deposition offset from the location of the first deposition where all of the cells except those associated with openings 714(a)–714(c) are active. As with FIG. 14B the outline of the regions not deposited to by the inactive cells are shown but without any filling pattern. FIG. 14D shows the result of the first through third depositions with the third deposition offset from the locations of both the first and second depositions. During the third deposition all of the cells except those associated with openings 714(a)–714(c) are active. As with FIGS. 14B and 14C, the outline of the regions not deposited to by the inactive cells are shown but without any filling pattern. FIG. 14E illustrates the net result of the three depositions without any indication of the locations of the non-deposition positions. As can be seen, a three step deposition pattern can be used to fill the entire region. Other patterns of selective deposition could be obtained using this embodiment by selectively controlling the activities of the cells associated with openings 714(a)–714(i) during the series of depositions.

Figure 15E:
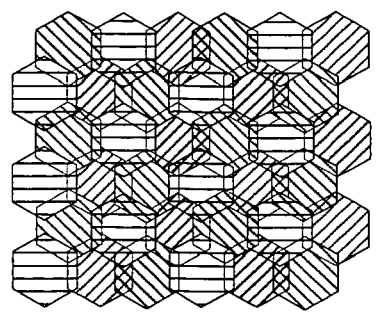
FIGS. 15A–15E depict a mask containing hexagonal openings spaced in a hexagonal pattern where the spacing between openings is less the width of the openings and an associated three-step overlapping deposition pattern that may used with such a mask.
Figure 15B:
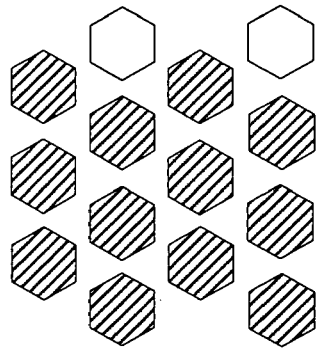
Figure 15D:
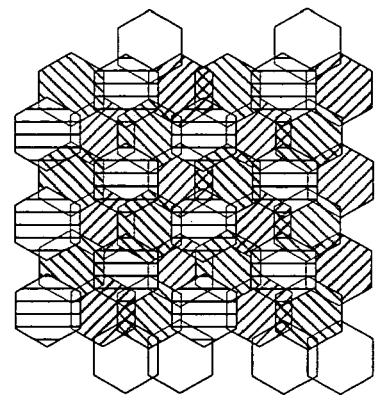
Figure 15A:
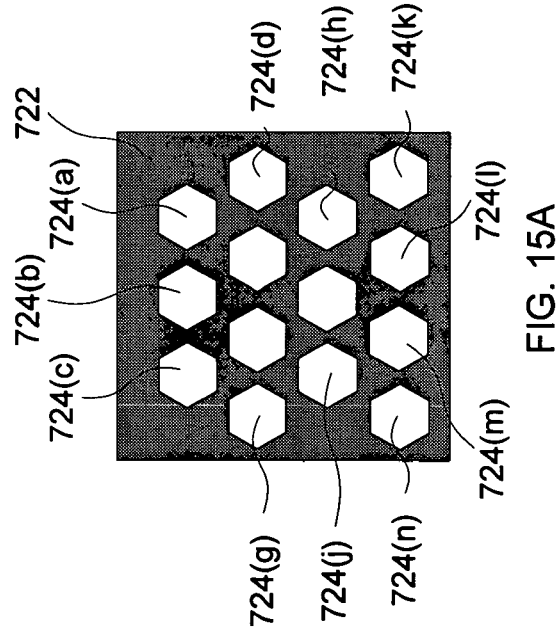
Figure 15C:
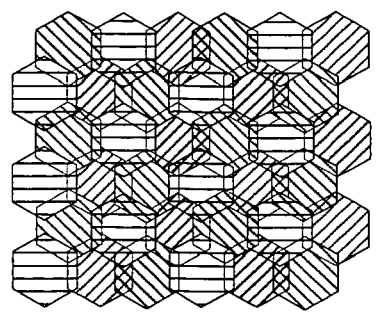

FIG. 15A depicts an alternative mask configuration 722 based on hexagonal openings 724(a)–724(n) that are spaced from one another by a region of dielectric material that has a configuration made up of triangle-like structures having their vertices truncated into short line segments. The configuration of these openings is such that the spacing between openings is smaller than the width of the openings along the three axes of the hexagon patterns that form the openings. The offsetting of the openings during successive depositions can occur in such a way that overlaps between the deposition's patterns can occur. In some alternatives the overlap may be symmetric while in other embodiments it may not be symmetric. This pattern of openings and dielectric may be used to form selective patterns of deposition in a three step deposition and shifting set of operations as illustrated in FIGS. 15A–15D. FIG. 15B depicts a top view of the deposition pattern that results from using the mask pattern of FIG. 15A where all cells but those associated with openings 724(d) and 724(k) are active. The cells associated with openings 724(d) and 724(k) are not active in this example as the pattern to be deposited doesn't require depositions from these cells during this first deposition operation. FIG. 15C shows the result of the first and second depositions with the second deposition offset from the location of the first deposition where all of the cells except those associated with openings 724(g) and 724(n) are active. As with FIG. 15B the outline of the regions not deposited to by the inactive cells are shown but without any filling pattern. FIG. 15D shows the result of the first through third depositions with the third deposition offset from the locations of both the first and second depositions. During the third deposition all of the cells except those associated with openings 724(g) and 724(n) are active. As with FIGS. 15B and 15C, the outline of the regions not deposited to by the inactive cells are shown but without any filling pattern. FIG. 15E illustrates the net result of the three depositions without any indication of the locations of the non-deposition positions. As can be seen, a three step deposition pattern can be used to fill the entire region. Other patterns of selective deposition could be obtained using this embodiment by selectively controlling the activities of the cells associated with openings 704(a)–704(n) during the series of depositions.

Figure 16B:
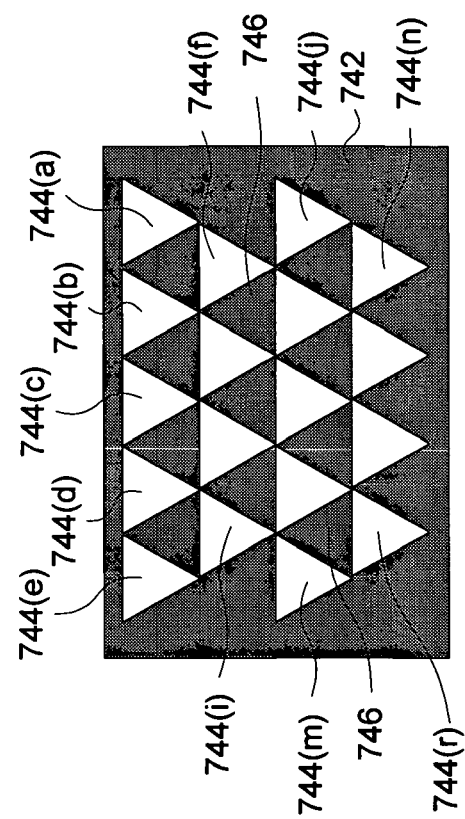
FIGS. 16A–16D depict two complementary masks with triangular shaped openings along with an associated two step deposition pattern that may be used with such a mask.
Figure 16A:
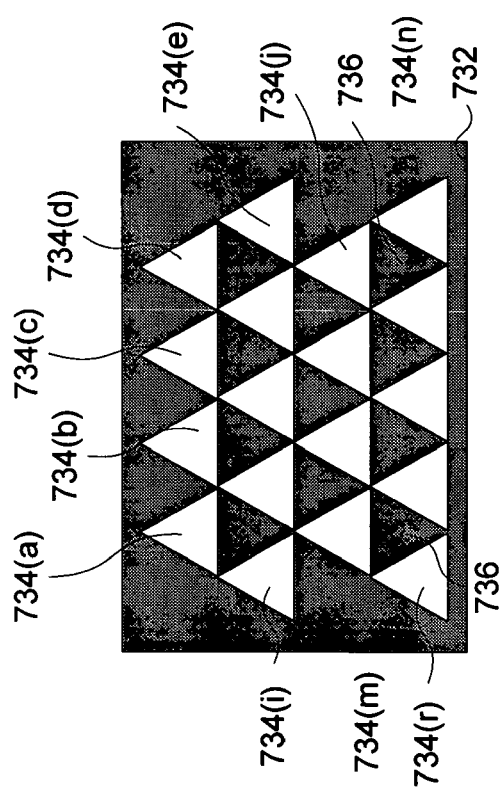
Figure 16D:
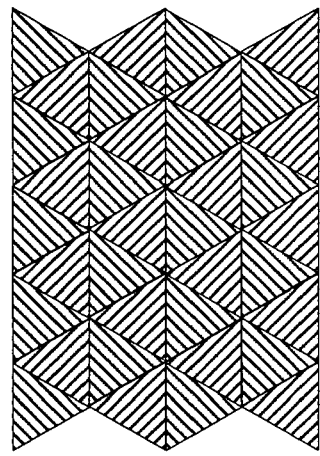
Figure 16C:
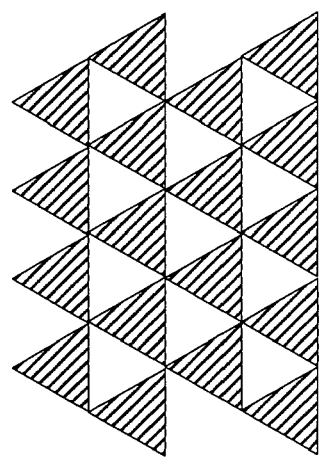

FIGS. 16A and 16B depict two alternative mask configurations 732 and 742 that include complementary triangular shaped openings 734(a)–734(r) and 744(a)–744(r), respectively, that define the effective deposition regions of their respective cells. Each opening takes a triangle form with the openings separated from other openings by triangular shaped sections 736 and 746, respectively, of dielectric material that are of the same size or slightly larger than the size of the openings. The mask of FIG. 16B may be a different mask from that depicted in FIG. 16A or it may simply be a rotated version of what is in FIG. 16A. This pattern of openings and dielectric may be used to form selective patterns of deposition in a two step deposition and shifting set of operations as illustrated in FIGS. 16C–16D. FIG. 16C depicts a top view of the deposition pattern that results from using the mask pattern of FIG. 16A where all cells actively participate in the deposition. FIG. 16D shows the result of the first and second depositions with the second deposition based on the mask of FIG. 16B and with the openings positioned over the dielectric locations from the first deposition operation. Other patterns of selective deposition could be obtained using this embodiment by selectively controlling the activities of the cells associated with openings 734(a)–734(r) and 744(a)–744(r) during the series of depositions.

Figure 17B:
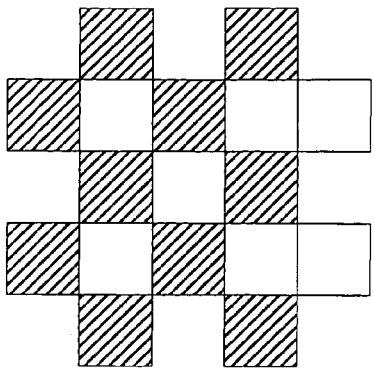
FIGS. 17A–17D depict a mask with square openings arranged in a checkerboard pattern along with an associated two step deposition pattern that may be used with such a mask.
Figure 17A:
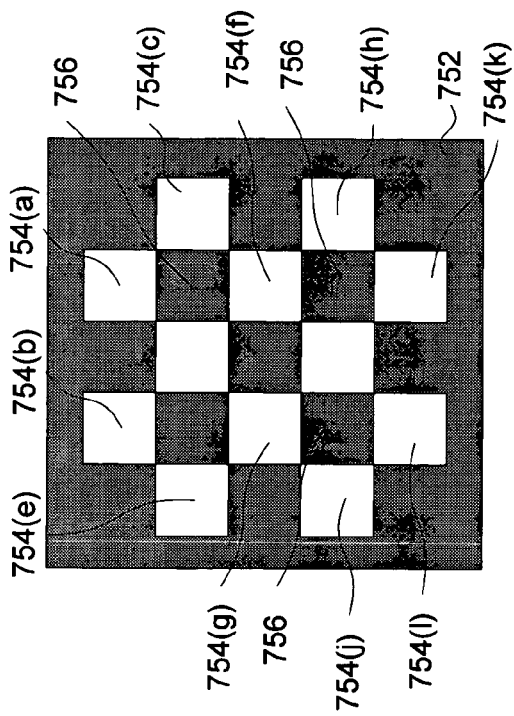
Figure 17D:
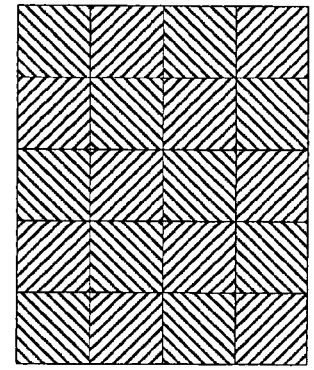
Figure 17C:
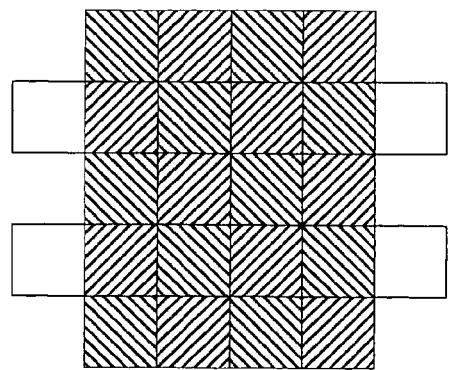

Another example of a two step embodiment is illustrated with the aid of FIGS. 17A–17D. FIG. 17A depicts an alternative mask configuration 752 that includes square openings 754(a)–754(l) located in a checkerboard pattern. Since the openings are located in a checkerboard pattern, the dielectric material that separates the openings is in a complementary checkerboard pattern. This pattern of openings and dielectric may be used to form selective patterns of deposition in a two step deposition and shifting set of operations as illustrated in FIGS. 17B and 17C. FIG. 17B depicts a top view of the deposition pattern that results from using the mask pattern of FIG. 17A where all cells except for those associated with openings 754(k) and 754(l) actively participate in the deposition. The non-participation of these cells is shown by the two lower square outlines that do not contain any filing FIG. 17C shows the result of the first and second depositions with the second deposition offset from the first deposition by the openings being positioned over the dielectric locations from the first deposition operation. Openings 754(a) and 754(b) do not participate in the second deposition as indicated by the outlined squares without filing as shown at the top of FIG. 17C. FIG. 17D illustrates the net result of the two depositions without any indication of the locations of the non-deposition positions. Other patterns of selective deposition could be obtained using this embodiment by selectively controlling the activities of the cells associated with openings 754(a)–754(l) during the series of depositions.

In alternative embodiments to those illustrated in FIGS. 16A–16D and 17A–17D, other opening patterns could be used. In other alternatives, the dielectric material separating the individual cells may be truncated where they meet at their corners such that a small gap exists that connects each cell. It is believed that this gap may not allow significant deposition from active cells to enter inactive cells but if such unwanted deposition occurs on a limited basis, it may be possible to perform an etching operation to remove the unwanted material without significantly distorting the desired deposition pattern.

As discussed herein above, in some embodiments due to the presence of overlapped depositions, non-uniformity of deposition height may be problematic. In some embodiments, this problem may be addressed by use of planarization operations to smooth the deposits. In other embodiments, selective etching may be used to enhance the uniformity of the deposition. An example of this type of technique is illustrated with the aid of the deposition pattern of FIG. 8A. A region associated with each cell receives deposits from a series of four depositions and offsets as indicated in FIGS. 18A–18D. First through fourth depositions occur at positions 802(a)–802(d), respectively, which are independently shown in relationship to the overall deposition region 804 that is controlled by a particular cell. The successive depositions change the net deposition pattern for the region. The resulting height of deposition after each of the four deposits is illustrated with the aid of FIGS. 19A–19D, respectively.

After the first deposition, as shown in FIG. 19A, the area 802(a) has a deposition height of one unit while the rest of region 804 has a zero deposition height.

FIG. 19B shows that region 804 contains four distinct deposition regions after completion of the second deposition: (1) a region 812(a) deposited to by only the 802(a) deposition and having a height of one unit; (2) a region 812(b) deposited to by only the 802(b) deposition and having a height of one unit; (3) a region 812(ab) deposited to by both the 802(a) and 802(b) depositions and having a height of two units; and (4) a remaining portion of region 804 that has yet to receive a deposit.

FIG. 19C shows that region 804 contains seven distinct deposition regions after completion of the third deposition: (1) a region 812a deposited to by only the 802(a) deposition and having a height of one unit; (2) a region 822(b) deposited to by only the 802(b) deposition and having a height of one unit; (3) a region 822(ab) deposited to by both the 802(a) and 802(b) depositions and having a height of two units; (4) a region 822(bc) deposited to by both the 802(b) and 802(c) depositions and having a height of two units; (5) a region 822(abc) deposited to by each of the 802(a), 802(b), and 802(c) depositions and having a height of three units; (6) a region 822(c) deposited to by only the 802(c) deposition and having a height of one unit; and (7) the remaining portion of region 804 that has yet to receive a deposit.

FIG. 19C shows that region 804 contains nine distinct deposition regions after completion of the third deposition: (1) a region 832a deposited to by only the 802(a) deposition and having a height of one unit; (2) a region 822(b) deposited to by only the 802(b) deposition and having a height of one unit; (3) a region 822(ab) deposited to by both the 802(a) and 802(b) depositions and having a height of two units; (4) a region 822(bc) deposited to by both the 802(b) and 802(c) depositions and having a height of two units; (5) a region 832(abcd) deposited to by each of the 802(a), 802(b), 802(c), and 802(d) depositions and having a height of four units; (6) a region 832(c) deposited to by only the 802(c) deposition and having a height of one unit; (7) a region 832(cd) deposited to by both the 802(c) and 802(d) depositions and having a height of two units; (8) a region 832(d) deposited to by only the 802(d) deposition and having a height of one unit; and (9) a region 832(ad) deposited to by both the 802(a) and 802(d) depositions and having a height of two depositions.

Ignoring possible flash related depositions that might occur as a result of imperfect mating between the mask and the substrate (especially in those regions that transition from one deposition height to another) and assuming that all four depositions that are within the region are used to deposit material, the four step pattern doesn't yield a uniform deposition depth but instead some portions of the region receive a single unit of deposition height, some receive two units of deposition height, and some receive four units of deposition height. A unit of deposition may be any height which is assumed to be the same for each deposition operation in this example but need not be in other embodiments. If the entire layer thickness is to be achieved by these four depositions, the height of deposit may be equal to that of the layer thickness or may be somewhat larger. If instead, multiple repetitions of this four step process are to occur, then the height of one unit may be a fraction of the layer thickness.

A potential problem with the resulting deposition pattern is that it doesn't have anything approaching a uniform deposition depth. In this example, the height of the deposition will vary by a factor of four. This may be non-problematic in some circumstances (e.g. when planarization will be used to bring the height of deposition down to a desired level, such as to the one unit height assuming the cost of deposition material, deposition time, planarization time, and the like are not too high).

As discussed above, an implementation of a deposition height or etching depth differential reduction technique may involve performing the reverse of a portion of the deposition or etching using specially shaped cells in a multi cell instant mask. As also discussed above, other alternatives may add to the results of a deposition or etching by additional deposition or etching using specially shaped cells.

One additional mask and etching operation may be used to bring the deposit differential down from 4:1 to 2:1. This extra mask could be used in a single etching operation to reduce all of the "4" unit depositions down to a lower level (e.g. a two unit level or even a one unit level). FIG. 20 illustrates a cell pattern that each cell of a supplemental multi-cell mask might possess for use in reducing the overall height differential. FIG. 21 illustrates multi-cells of a mask that includes openings like that of FIG. 19 arranged in a square array. FIG. 22 depicts a sample pattern that might be deposited by 6 cells C1–C6 of a multi-cell mask where each active cell (e.g. cells 1, 2, 5, and 6) deposits the pattern of FIG. 18D while FIG. 23 depicts the resulting net deposit after a single etching operation using the mask of FIG. 21 with active cells corresponding to those that were active during the deposition operations. Of course the resulting height of the original four units may take on any value but in this example, it has been assumed they would be reduced to a two unit height.

If it were desired to bring the net deposition differential down even further, a desired mask pattern could be used to etch the portions of the deposit that are thicker down to match the height of the thinner deposit (e.g. etch the two unit height down to a height of about one unit). Alternatively, additional material may be deposited (e.g. using a mask having cells with an appropriate pattern) to the thinner portion of the deposition to bring it closer to the height of the thicker portion of the deposit (e.g. to bring the height of the one unit thick portion to about the height of the two unit portion). The additional etching operations may involve 2 or more offsets with specially configured cells.

Figure 24A:
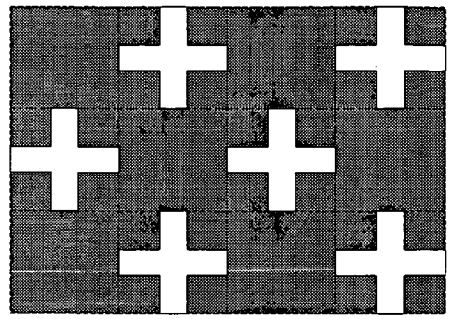
FIGS. 24A and 24B depict sample mask configurations and patterns that might be used in further etching material from an overlapping pattern of deposits like that shown in FIG. 23.
Figure 24B:
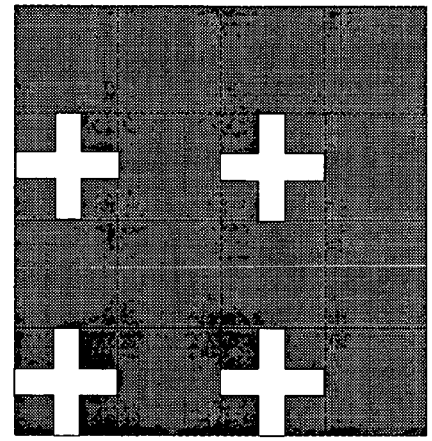

For example the mask of FIG. 24A may be used to etch down the two unit thick portion in two offset etching operations while the mask of FIG. 24B may be used to etch the two unit thick portion in four offset etching operations.

Though the above approach of depositing extra material and then selectively etching away the excess material achieves the desired result, it may not be as time efficient as an approach that deposits material so that the overlapped portions (e.g. the portions that receive multiple deposits) reach the desired height while the non-overlapped portions are subsequently filled in using one or more masks of desired configuration.

As discussed elsewhere herein, some embodiments may use bubble formation to control the activity of individual cells of a multi-cell mask. In an embodiment that doesn't contact the masks against the substrate during deposition, it is possible that multi-step plating will not be necessary. In other words, a single position of the cells may be able to plate all appropriate portions of the substrate. If the bubbles seal the cells and possibly partially locate themselves under the cell dielectric boundaries, three unique situations can occur at cell boundary lines: (1) Off-cell meets off-cell—no depositions within cells and no depositions under cell dividers; (2) Off-cell meets on-cell—deposition in on-cell—no deposition in off-cell—extent of deposition under cell dividers depends on the extent the bubbles are located under the dividers; and (3) On-cell meets on-cell—depositions in the cells—deposition under the dividers (height of deposition is limited to that of the spacing between the dividers and the substrate).

Variations of these three situations can occur. In particular the final deposition position and boundary shape in situation (2) can impact the accuracy of the final structure and the surface finish of a series of stacked layers. In situation (3) if the divider is too close to the substrate the entire region under the divider may not fill in prior to the deposit on each side sealing against the divider.

It is believed that in some embodiments it may be possible to perform the mask and substrate set up, cell activation (and/or deactivation), and the deposition operations such that entire layers may be formed using single depositions. It is also believed that the process may be performed such that the position of boundary lines between deposition and non-deposition zones may be sufficiently predictable that the original structure/object/device data may be modified to enhance the accuracy of the final produced structure. It may also be possible to tailor the process, mask cell divider shape, etc. so that boundary shape is also optimized.

Figure 25:
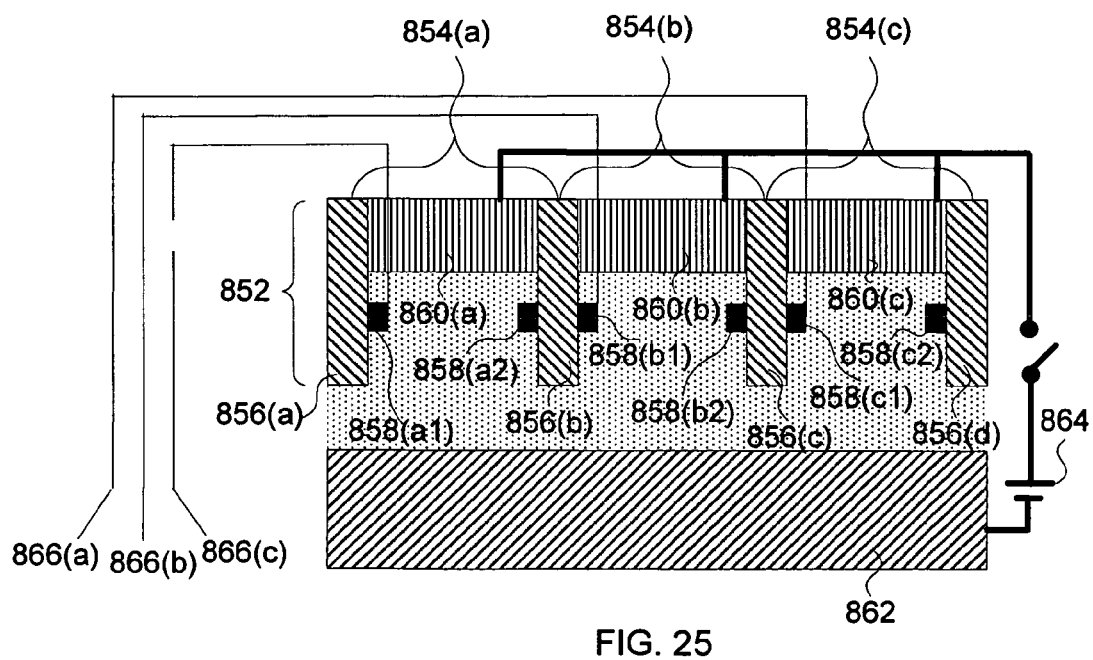
FIG. 25 depicts a side view of a multi-cell mask where the cells include control elements that may be used to form bubbles that can inactivate selected cells.

An example of a mask and two sample depositions are shown in FIGS. 25–29. FIG. 25 illustrates a mask 852 that includes three cells 854(a)–854(c). The mask also includes dielectric extensions 856(a)–856(d) that separate the cells from one another and each cell includes control elements 858(a1) and 858(a2), 858(b1) and 858(b2), and 858(c1) and 858(c2), respectively. The control elements may be bubble generation electrodes that may be formed from a non-erodable material through which a current can pass to hydrolyze a portion of an aqueous plating bath with minimal material transfer between the electrodes. The cells may be of the pass through-type (anodeless-type) or they may include erodable anodes 860(a)–860(c), respectively, that can give up material during deposition operations. The mask is positioned relative to a substrate 862 and a controlled current source 864 is connected between the anodes 860(a)–860(c) and the substrate for powering the deposition of material once the activation/deactivation of each cell is set. An electrolyte (e.g. a plating solution) is located within the cells between the control elements and between the anodes and the substrate. The control elements for the cells may be connected via independent lines to controllers 866(a)–866(c) or they may be connected to a controller or to a reduced set of controllers via wiring and circuitry for multiplexed control. In the case of the control elements being hydrolysis electrodes they may be powered by either a DC voltage or an AC voltage which might help limit any material deposition to the electrodes.

Figure 26:
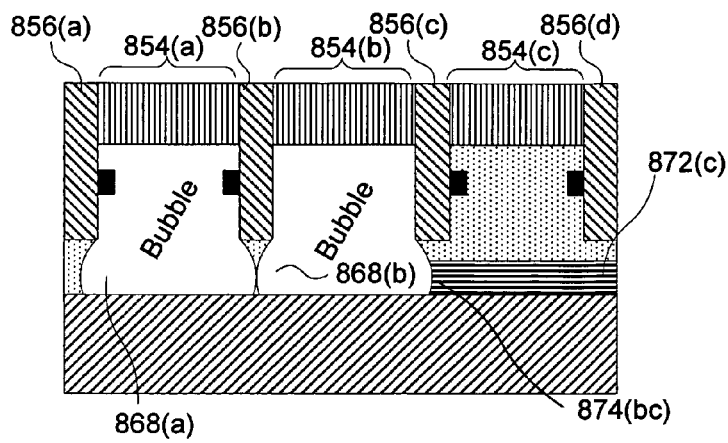
FIG. 26 depicts use of the multi-cell mask of FIG. 25 with two of the cells inactivated.

FIG. 26 depicts the mask of FIG. 25 where cells 854(a) and 854(b) are shown as deactivated by the formation of bubbles 868(a) and 868(b) while cell 854(b) is not blocked by a bubble and thus remains active such that deposition 872(c) may be formed. As can be seen the formation of bubbles 868(a) and 868(b) partially extend under dielectric dividers 856(a)–856(c) such that the boundary between deposition regions and non-deposition regions is set as indicated by boundary 874(*bc*).

Figure 27:
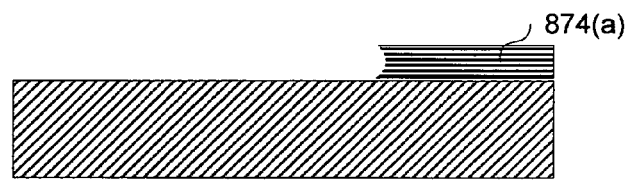
FIG. 27 depicts the deposit that resulted from the operation illustrated in FIG. 26.

FIG. 27 depicts the deposition of FIG. 26 after the mask has been moved away from the substrate.

Figure 28:
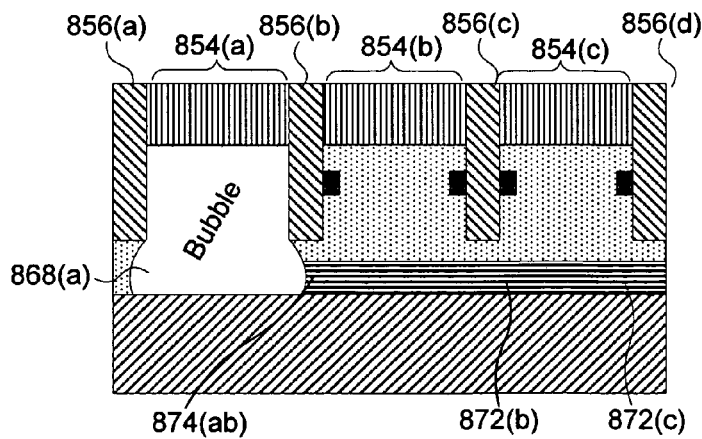
FIG. 28 depicts use of the multi-cell mask of FIG. 25 with one of the cells inactivated.

FIG. 28 depicts the depicts the mask of FIG. 25 where cell 854(*a*) is deactivated by the formation of bubble 868(*a*) while cells 854(*b*) and 854(*c*) remain active such that deposition the combined deposition 872(*b*) and 872(*c*) may be formed. As can be seen the formation of bubbles 868(*a*) partially extends under dielectric dividers 856(*a*)–856(*b*) such that the boundary between deposition regions and non-deposition regions is set as indicated by boundary 874(*ab*).

Figure 29:
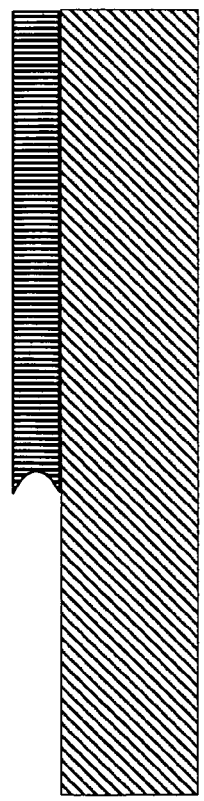
FIG. 29 depicts a side view of the deposit that resulted from the operation of FIG. 28

FIG. 29 depicts the deposition of FIG. 28 after the mask has been moved away from the substrate.

From FIGS. 26–29 it is clear that the embodiment appropriately handles the interface between "on—on" cells, "off—off" cells, and "on-off" cells with a single deposition without need for horizontal shifting.

In alternative embodiments many features of the embodiment of FIGS. 25–29 are possible. For example, the width of the dielectric dividers relative to the width of the cells may be different. The separation between cell dividers and the substrate may be different. It is preferably at least one layer thickness and possibly a bit more so that a deposition thickness between the dividers and the substrate can be at least one layer thickness and preferably somewhat more. The shape of the dielectric dividers can vary, for example, by making their lower extremes have a curved shaped. As in ELEX™ approaches to EFAB, as set forth in U.S. patent application Ser. Nos. 10/271,574, Oct. 15, 2002 by Cohen et al. which is incorporated herein by reference, the separation between the mask and substrate may start off small and increase as the deposits thicken. An analogous process may be possible for selective etching possibly with the separation decreasing as etching depth increases.

Figure 30:
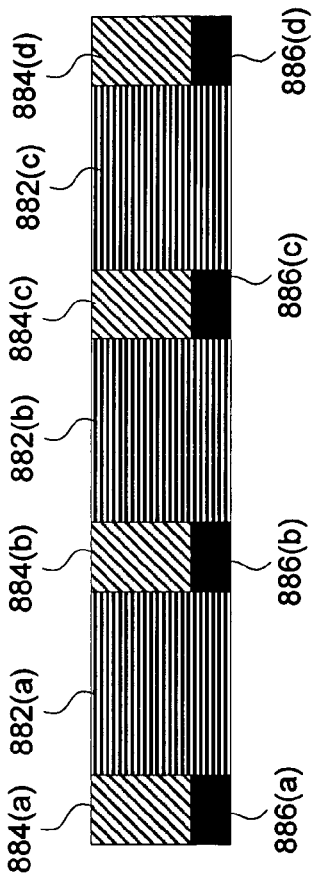
FIG. 30 depicts an alternative version of a multi-cell mask where the dielectric dividers do not extend beyond the functional cell components but instead bubble generators may be used to form dividers between selected cells.

In still further alternatives, the bottom surface of the dielectric dividers may contain bubble producers and such masks bubble producers may allow use of masks where the physical dielectric doesn't extend below the cell electrodes and maybe even where the dielectric doesn't completely extend to the bottom of the cell electrodes. This is illustrated in FIG. 30 where cell electrodes 882(*a*)–882(*c*) are held separate by dielectrics 884(*a*)–884(*d*) with bubble generator located between the dielectrics. In these alternatives the bubble generators could create dividers between those cells where necessary to separate "on" sections from "off" sections and individual control of cell activity could control which cells are powered for deposition and which are not.

In still other alternatives, the orientation of the mask and substrate of FIG. 25 may be inverted such that gravity may cause the bubbles to rise and contact and seal the mask and the substrate without the bubbles first needing to fill their entire respective cells.

In still further embodiments, the bubbles may not need to contact the substrate. In these alternatives, the sealing between the mask and the substrate may be caused by contact between the cell dividers and the substrate where the bubbles are simply used as cell inactivators/controllers.

Figure 31:
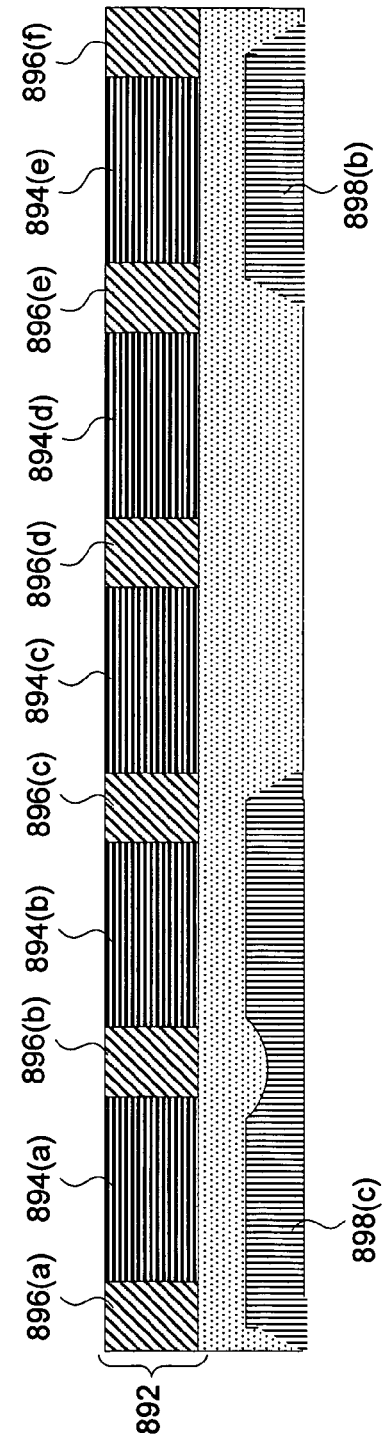
FIG. 31 depicts use of a multi-cell mask that doesn't use dividers that extend beyond the level of the electrodes.

In still other alternative embodiments, the spacing between the substrate and the mask and the divider width may be sufficient to limit depositions to individual cell regions with or without formation of bubbles that bridge the space between the mask and the substrate. An example of this is illustrated in FIG. 31 where a mask 892 includes five cells (i.e. deposition electrodes 894(*a*)–894(*e*), respectively) separated by dielectric dividers 896(*a*)–896(*f*). In the example, illustrated the dividers do not extend beyond the face of the deposition electrodes and it is assumed that cells 894(*c*) and 894(*d*) are not powered for deposition while the other cells are. A deposit resulting from this operation of this mask is indicated by reference numerals 898(*a*) and 898(*b*) this In alternatives embodiments, FIGS. 25–31 and their various alternatives may be used in combination with offsets and extra depositions. This may be particularly useful if adjacent on-cells are incapable of completely bridging the divider regions either as a result of the dividers contacting the substrate or by the width of the divider making bridging impossible or unreliable.

In still further alternatives, the masks containing anodes may be replaced by anodeless-type masks. For bubble forming embodiments this alternative is particularly enabled by the substrate being on top so that bubbles don't escape from the cells. This alternative may work in the mask-on-top approach if the passages are bridged by a porous structure that inhibits the passage of bubbles or where surface tension effects reliably hold the bubbles in place.

Other multi-cell programmable mask embodiments may involve varying the cell divider height. The divider height could be made high where transitions from active cell regions to inactive cell regions occur such that those dividers could seal the mask to the substrate. Dividers separating active cells from one another or inactive cells from one another could be set low so they would not contact the substrate. In these embodiments it may be preferable to have the dividers along each wall of each cell to be capable of independent movement. The divider height sets, seals, and separates the active and inactive regions from each other as well as allows flow between all connected cells of a single type. Each cell is still preferably independently controlled for deposition or no deposition.

Figure 32A:
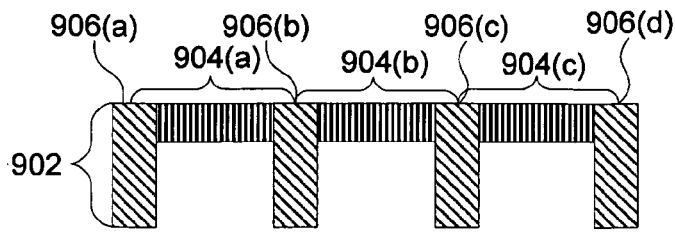
FIGS. 32A–32D depict a process for changing the height of selected dielectric separators according to an embodiment of the invention where the dividers include a material whose shape can be modified.
Figure 32B:
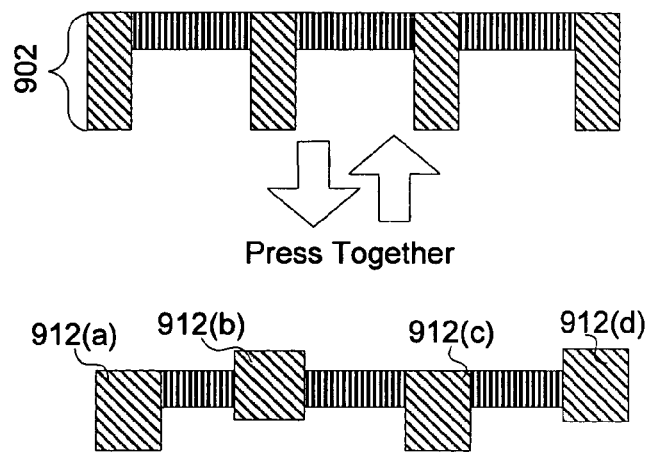
Figure 32C:
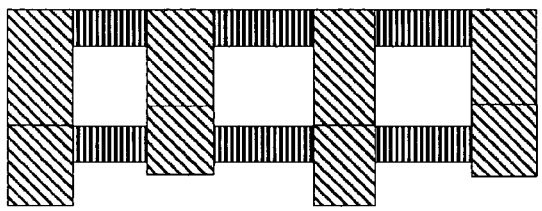
Figure 32D:
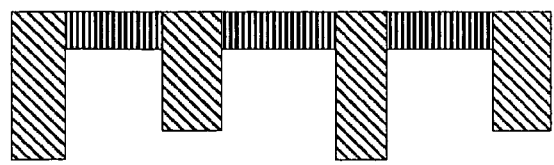

The heights of the dividers may be set in various ways. For example, in some embodiments, the height of the dielectric may be set by pushing it against an appropriate pattern (e.g. a programmable solenoid or electrostatically controlled bed of rods) that can set the dielectric to a high or low state. The dielectric may, for example be heated when it is pressed against the bed to place it in a modifiable state so that its shape may be adjusted. It may be cooled prior to removing it from the bed to lock it into position before removing it from the contouring pattern. This method of setting divider height is illustrated in FIGS. 32A–32D. FIG. 32A depicts a side view of a mask 902 having three cells 904(*a*)–904(*c*) separated by dielectric dividers 906(*a*)–906(*d*) where the dividers may be formed from a shape memory material (i.e. a material that has a nominal shape that can be made to take a modified shape and then reset to its original shape, for example by heating). FIG. 32B shows mask 902 in position for being mated to contour pattern bed 908 which includes moveable rods 912(*a*)–912(*d*). Rods 912(*b*) and 912(*d*) are shown in elevated positions while rods 912(*a*) and 912(*c*) are shown recessed positions. Before bringing the mask and the bed into contact with one another, the mask, if necessary to take and hold a temporary deformed shape, may be heated. This heating operation may be used to cause all elements of the dielectric to extend to their normal lengths. The mask and bed are then pressed together as shown in FIG. 32C where the mask takes on the shape of the bed (if necessary the mask may be in a heated state during the application of pressure). Prior to separating the mask and the bed, the mask is cooled (if it were heated during pressing) to lock it in the modified shape. The deformed mask is illustrated in FIG. 32D and is ready for use.

In some alternative embodiments, if the mating properties (e.g. deformability or elasticity) of the selected shape memory material are inappropriate to obtain the desired conformity for sealing the mask and the substrate, the shape memory material may have a region of conformable material applied to its surface (e.g. PDMS).

A second embodiment may achieve differential height of the dielectric divider material by contacting the dividers to a material that will temporally adhere to them. This material may be selectively applied to the transitional boundaries to increase their height. After mating and deposition the temporary material may be removed and a new pattern of extender material may be applied to the multi-cell mask's transitional dividers. The extender material may be a material deposited directly onto the divider or may be a material that is first patterned onto a different surface and then transferred to the dividers; The material may, for example, be applied by ink (such as a wax-like material). It may be a toner that is deposited electrostatically.

An example of a transfer approach is shown in FIGS. 33A and 33B. FIG. 33A depicts a mask 922 pressed against a pattern transfer base 926. The mask includes dielectric dividers 924(a)–924(d) having uniform length. The base 926 includes previously deposited features 928(a), 928(c) and 928(d). FIG. 33B shows the mask 922' separated from the base 926' where the features 928(a), 928(c), and 928(d) have been transferred to the ends of dielectric dividers 924(a), 924(c), and 924(d) to extend their length. The mask 922' is ready for deposition operations after which the extension features may be removed.

Another example of a transfer approach is shown in FIGS. 34A–34C. This alternative has some similarities to the FIGS. 33A–33B approach but instead of transferring material only to the bottoms (or tops) of the dividers, a border of material is transferred to the surface of the mask where the border may overlay not only the dielectric material but also the openings of the cells so as to form a boundary between deposition regions and non-deposition regions. In some embodiments the boundary material may free the deposition and non-deposition regions from the quantized dimensions of the cells. FIG. 34A shows a top view of the cells of a mask 932 prior to transfer of a boundary material 934. FIG. 34B shows a top view of the mask 932' after transfer of the boundary material 934 while FIG. 34C shows a side view of the mask 932' along lines 34(c)—34(c) of FIG. 34B where the thickness added by the boundary material 934 can readily be seen. In some embodiments, the border may be formed on a separate surface and then transferred to the selected dividers/cells of the mask or alternatively it may be formed directly onto the multi-cell mask. The pattern may for example be formed via inkjet deposition or an extrusion technique such as fused deposition modeling In the above differential height embodiments, the created masks are used to contact the substrate such that the entire region can be patterned by a deposition in a single process; however in other embodiments proximity positioning of the mask relative to the substrate might allow adequate separation of the deposition and the non-deposition regions.

Figure 35A:
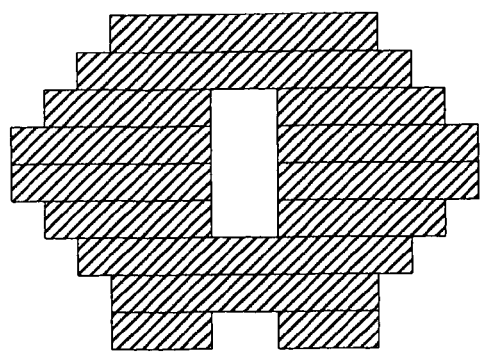
FIGS. 35A–35F depict side views of structures exemplifying example of different overlay patterns that might result from using multi-cell masks with different sized openings and/or by changing the relative positioning of deposition locations periodically
Figure 35B:
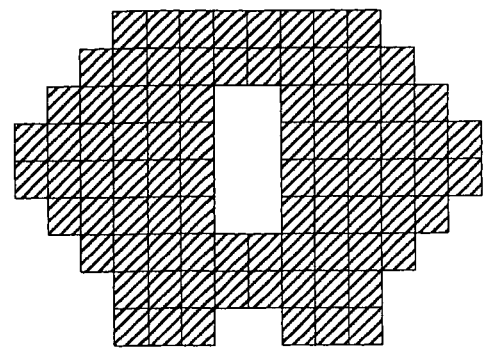

In some embodiments cell position may be aligned from layer-to-layer while in other embodiments cell positioning may be shifted between consecutive or periodic layers. In still other embodiments, cell size may be varied on different layers or even varied within a layer. Embodiments that vary cell alignment positioning or cell sizing may yield structures with different mechanical properties than similarly configured structures that are produced when cell alignment is maintained fixed from layer-to-layer. Such formation techniques are contrasted in FIGS. 35A–35F. FIG. 35A depicts a side view of an object containing a number of layers without explicit indication of the cell boundaries that were used during its formation. FIG. 35B depicts a side view of the object of FIG. 35A which is formed from a multi-cell mask where cell size is fixed and cell alignment is fixed (i.e. no offsetting of cells occur) between layers.

Figure 35C:
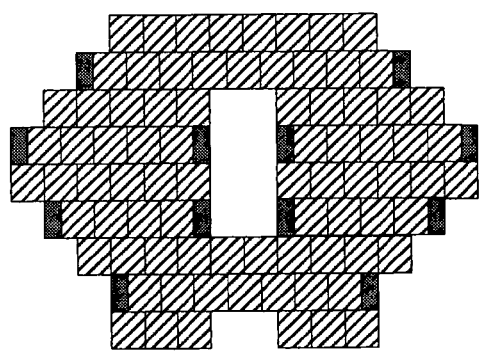

FIG. 35C depicts a side view of an object produced when offsetting is used on consecutive layers. As illustrated, the offsetting or shifting is from cell edge to cell midpoint on every other layer. In the embodiment of FIG. 35C some depositions appear to have half the width of other depositions. This apparent deposition size variation may be obtained in two ways: (1) smaller cells may be used in making some edge deposits while larger sized cells are used to make interior deposits (i.e. deposits that do not have an edge that matches the edge of the layer) and exterior deposits (i.e. deposits that do have at least one edge that matches the edge of the layer) when those exterior deposits can be made without loss of layer positioning or size resolution, or (2) the same sized cells may be used for all depositions but exterior depositions may be made with the cells at shifted positions when the shifting is required to maintain a desired layer size or resolution.

Figure 35D:
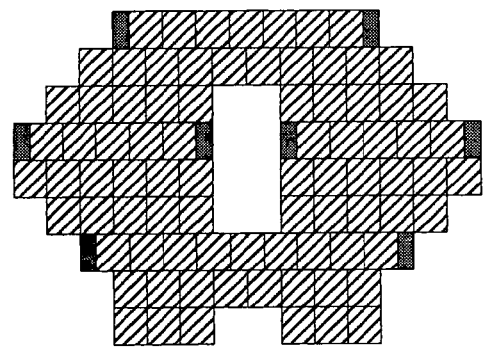

FIG. 35D depicts the use of shifted cells on every third layer and the use of different sized cells or cells with special shifting when exterior layer features require it.

Figure 35E:
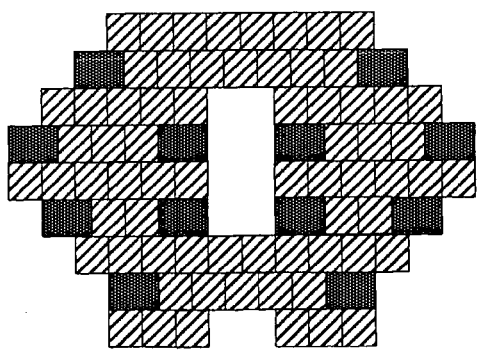

FIG. 35E depicts the use of shifted cells on every other layer in combination with larger cells when needed to form exterior portions of layers when the larger cells can be effectively used to obtain proper layer sizing.

Figure 35F:
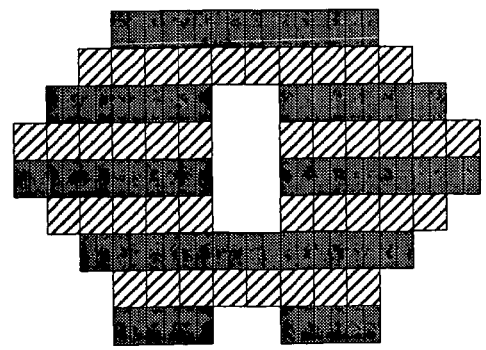

FIG. 35F depicts an embodiment where a different sized cell is used in the formation of every other layer.

In further embodiments different cell size relationships may be used and different offsetting or shifting parameters may be used. Deposition may not concern itself with maintaining layer size or feature position with regard to an original design concept but instead may base layer size and/or feature position on the desired cell alignment positions and quantization thus associated with each layer. The quantization may determine whether or not any given cell position is a deposition position or not based on some predefined criteria. Examples of such criteria include: (1) formation of over-sized structures in that any data calling for material presence within a given deposition position may dictate that the deposition is to occur, (2) formation of undersized structures in that for a determination of a deposition position to receive deposition the entire position must possess data that indicates that material is to be present, (3) an averaged sized approach in that determination of deposition may be based on the percentage of a given deposition position for which the data indicates material is to exist.

In alternative embodiments the cell electrodes can take on different forms ranging from porous structures to peripheral rings. For example, a cross of conductive material may extend to the center of a cell or a line of conductive material may be suspended in the center of a cell. In still other alternatives the cell electrodes may be segmented and multiple feeds used to apply a variety of potentials to a single cell. In some embodiments, the conductive material of the electrodes may be exposed to the electrolyte while in other embodiments they may be isolated from the electrolyte.

In still further embodiments, the cell electrodes may be provided with a sufficient potential difference relative to the other electrodes that a significant amount of gas may be produced (e.g. via hydrolysis or vaporization) that could help limit etching from the inactive cells. If bubble generation is found to be unproductive or otherwise bothersome, agitation or electrolyte flow may be used to sweep bubbles away such that problems with etching from active cells are minimized.

In various alternative embodiments, layer build up may occur from a combination of selective depositions of one or more materials from a multi-cell programmable mask. Other alternatives could use a combination of selective depositions from a multi-cell programmable mask and from one or more structure or device specific masks. In other embodiments, selective deposition from multi-cell programmable masks may be combined with blanket depositions. In still other embodiments, planarization operations may be used after deposition of all material for a given layer and/or intermediate to the deposition of all material for a given layer.

In various other alternatives, selective etching may be performed in combination with selective depositions and/or blanket depositions. Various electrochemical fabrication techniques that use etching are described in the previously referenced U.S. Pat. No. 6,027,630 and in U.S. patent application Ser. No. 10/434,519, filed May 7, 2003 by Smalley, and entitled "Methods of and Apparatus for Electrochemically fabricating Structure Via Interlaced Layer of Via Selective Etching and Filling of Voids". This patent application is incorporated herein by reference as if set forth in full. Selective etching In still other alternatives, holes of varying depth or deposits of varying thickness may be generated by varying the pattern of active cells. The changing of patterns may occur in the middle of a deposition. The changing of patterns may occur during a shifting of the deposition pattern from one location to another. In other embodiments, the mask may be separated from the substrate in the middle of a deposition to allow the electrolyte to be refreshed.

In various other embodiments, specific cells can be turned on or off independent of the switching on and off of other cells. In this regard certain locations can undergo longer or shorter depositions as desired. For example, if an electrical short is detected, the shorted cell can be turned off. The shorted cell can undergo a reversal in polarity in an attempt to eliminate the nodule or other feature that caused the short. If necessary, the mask may be lifted away from the substrate to break contact with the nodule, be reseated, and then a reversal in polarity implemented in an attempt to eliminate or reduce the nodule prior to attempting to complete the deposition In various other embodiments, the cell control electrode may be replaced or supplemented by other control elements. Multiple cell electrodes may be located in each cell. Some cell electrodes may be insulated by a dielectric. The control elements can take various forms with the intent that they allow cells to toggle between active and inactive states. For example, heating elements may be included in the cells to form gas bubbles that can block or significantly limit the ability of ions to be conducted to or from the substrate thereby causing formation of an inactive cell. The cell can be made active again in various ways. For example, the cell may be reactivated by separating the mask and the substrate and introducing a vibration, agitation, or flow of electrolyte in the region of the cell to dislodge or otherwise remove or eliminate the bubble. Bubble formation may be made to occur in a variety of ways. For example, bubble formation may occur by creating sufficient resistive heat or radiative heat to vaporize a small quantity of liquid in the electrolyte or by passing an electrical current through the electrolyte within the cell so a portion of the liquid undergoes hydrolysis (i.e. from 2H2O to 2H2 and 2O2). Other control elements may be used to cause the movement of mechanical element from an open position (active) to a closed position (inactive) via an electrostatic or magnetic force. Still other control elements may use cooling to freeze or otherwise lower the mobility of ion transfer through an inactive cell.

In some embodiments a surface of the dielectric forming the grid of cells will contact the substrate to form a seal around each cell while in other embodiments the dielectric forming the grid of cells will not contact the substrate but will be located close enough to it (in proximity to it) to cause a reasonable amount of isolation between deposition and/or etching operations in adjacent cells (for example to yield an effective ratio of deposition height or etching depth in active cells to that in inactive cells of 5 or greater or even 10 or greater). In embodiments that use a bubble formation to create inactive cells, bubbles formed against the substrate may aid in forming a seal between the inactive cell and any active adjacent cells. In still other embodiments, the dielectric forming the grid of cells may have indentations or ridges on its contact surface to inhibit complete sealing between the mask and the substrate. This incomplete sealing may be useful when bubble formation is used to inactivate cells as it may leave small flow paths for displaced liquid to escape. In other embodiments, cell energization (i.e. transition to and from active and inactive states) may occur in a predefined order. The predefined ordered may be selected, for example, to minimize the risk of trapping excess electrolyte (e.g. via bubble formation) within a portion of the mask.

In embodiments where, proximate positioning is used between a mask and the substrate, instead of holding a given deposition/etching position for a time, then stopping deposition/etching, making a transition to a new position, and then restarting deposition/etching, it may be possible to simply perform a continuous orbit within a desired deposition/etching region for a desired period of time. The orbiting pattern may be selected to give a desired pattern of differential deposition/etching. If the width of deposition/etching region is at least twice the width of a cell it may be possible to achieve uniform deposition or etching if an appropriate orbiting pattern is selected.

Figure 36A:
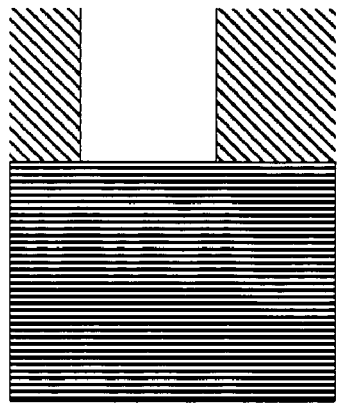
FIGS. 36A–36D illustrate some aspects of multi-cell mask use in multi-step etching operations.
Figure 36B:
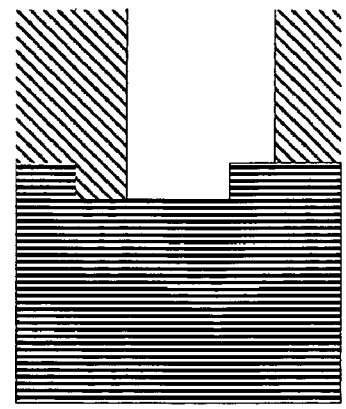
Figure 36C:
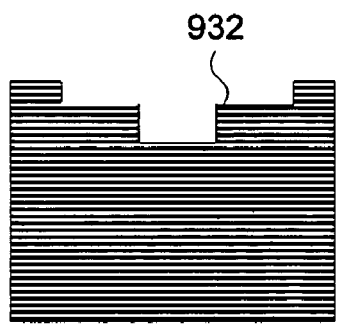
Figure 36D:
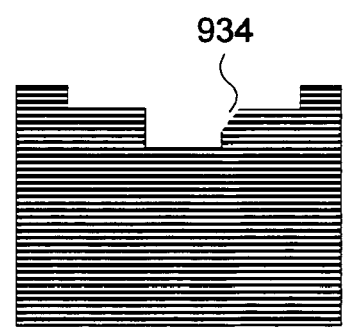

While the disclosure herein has focused primarily on the use of multi-cell masks for deposition purposes, other embodiments may also be used to selectively etch material in a manner largely analogous to the techniques used for depositing material with the distinction that in partially overlapped etching operations corners of etched material may be removed more quickly than planar regions and thus sharp cornered regions may become rounded. This is illustrated in FIGS. 36A–36D. FIG. 36A shows a side view of a mask positioned over a substrate in position for a first etching operation. FIG. 36B shows the mask and substrate after a first etching operation where the mask as been shifted to the right for a second etching operation. FIG. 36C depicts the result of the second etching operation where only vertical etching has occurred and the corner 932 remains sharp, while FIG. 36D depicts a possible result when a more isotropic etching occurs and where corner 934 becomes flattened. This may be a disadvantage in some applications but it may also be an advantage in other applications.

In some embodiments where the cells of the mask will be used for etching, it may be preferable to set the region width to somewhat larger than an integral number of cell widths such that tolerances in size and positioning ensure that overlapping etching regions do not initially occur but such that small regions of separation will be readily removed by the etching operations and that any overlapping etching is minimized.

Multi-cell masks may be fabricated in a variety of ways including the use of electrochemical fabrication on integrated circuits that act as substrates, molding operations, or ablation operations (e.g. to shape dielectric materials), use of electrochemical fabrication (e.g. via deposition specific masks) to form electrodes and conductive paths, and etching operations may be used to make passages, and the like. In some embodiments photoresist processing techniques may be used to form patterned masks.

In some embodiments of the present invention a means for depositing material may be used. This means may provide a selective deposition or a blanket deposition. This means may include a multi-cell mask or other mask if the deposition is to be selective. The means may include various components that are useful for applying a material to the substrate in a variety of ways, such as for example: (1) electroplating, (2) electrophoretic deposition, (3) electrostatic deposition (4) chemical vapor deposition, (5) physical vapor deposition, (5) spraying such as thermal spray metal deposition, (6) flinging of a liquefied material or a material in a binder or other carrier, (7) spreading such as by brush, doctor blade, or roller, (8) ink jet deposition, (9) contacting, spinning, and drying or otherwise curing. Techniques for forming three-dimensional structure using thermal spray metal deposition processes are described in U.S. Provisional Patent Application No. 60/422,008, filed on Oct. 29, 2003 by Lockard, entitled "EFAB methods and apparatus including spray Metal Coating Processes". This application is incorporated herein by reference as if set forth in full. The means may take on various other forms or may be a combination of apparatus implementing the above processes. The specific elements that may be used with the above noted processes, and variations thereof are well understood. Other deposition means will be apparent to those of skill in the art upon review of the teachings herein. Some alternative means may be described in the various publications and patents incorporated herein by reference.

In some embodiments of the present invention it may be possible to separate the multi-cell masks into two or more pieces. For example, the portion of the mask that contacts the substrate may be formed on the substrate while the portion of the mask that contains the electrodes, and the like, may be contacted against an already adhered grid pattern of dielectric material. The gird pattern of dielectric material that is adhered to the substrate may be formed from patterned photoresist, photopolymer or the like. Embodiments with such split multi-cell masks may have the advantage of requiring less precise positioning of the active part of the mask so long as the adhered portion is placed with adequate precision.

In some embodiments the controllable masks may be reduced to a single cell that can be used to draw out a desired deposition much like a pen is used to draw patterns one dot or line at a time. In still other alternative embodiments, the single cell may be used to cause selective etching of various portions of a substrate or portions of a partially formed layer. In still further embodiments the grid of multi-cell masks may be configured in a linear array much like some ink jet print heads are arrayed.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not electrodeposition processes. Some embodiments may use nickel as a structural material while other embodiments may use different materials such as gold, silver, or any other electrodepositable materials that can be separated from the copper and/or some other sacrificial material. Some embodiments may use copper as the structural material with or without a sacrificial material. Some embodiments may remove a sacrificial material while other embodiments may not. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

I claim:

1. A process for forming a multilayer three-dimensional structure, comprising:
    (a) forming a layer of at least one material on a substrate that may include one or more previously deposited layers of one or more materials;
    (b) repeating the forming of (a) one or more times to form at least one subsequent layer on at least one previously formed layer to build up a three-dimensional structure from a plurality layers;
    wherein the forming of at least one layer, comprises:
        (1) supplying a substrate on which one or more successive depositions of one or more materials may have occurred;
        (2) supplying a multi-cell mask, wherein each cell is separated from other cells by a material, wherein the cells of the mask comprise independently controllable electrodes, and wherein a pattern of dielectric material extends beyond the cell electrodes for contacting the substrate and for forming electrochemical process pockets when such contact is made;
        (3) bringing the multi-cell mask and the substrate into contact such that electrochemical process pockets are formed having a desired registration with respect to any previous depositions and providing a desired electrolyte solution such that the solution is provided within the electrochemical process pockets; and
        (4) applying a desired electrical activation to at least one desired cell electrode, to the substrate, and to any other desired electrode or electrodes, such that a desired material is selectively deposited onto the substrate.

2. The process of claim 1 wherein there is no other desired electrode or electrodes that are to be activated.

3. The process of claim 1 wherein at least a portion of the dielectric material that extends beyond the cell electrodes comprises a conformable material.

4. The process of claim 1 wherein the applying results in electroplating of the desired material on to the substrate.

5. The process of claim 1 wherein the formation of the three-dimensional structure comprises at least the deposition of two different materials during the formation of at least a portion of each of the plurality of layers.

6. The process of claim 1 wherein a plurality of the cells of the multi-cell mask comprise an electrodepositable material that may be deposited during the applying operation.

7. The process of claim 1 wherein a plurality of selective depositions using the multi-cell mask are performed during formation of a desired pattern of material on a given layer and wherein at least a portion of the plurality of selective depositions utilize a cell whose potential deposition positions are offset between at least two of the plurality of selective depositions.

8. The process of claim 7 wherein at least a portion of the offsets of a cell result in locating the cell to a potential deposition position that partially overlaps a previous deposition position associated with a previous registration of the cell.

9. The process of claim 7 wherein the cell is made active when located at a portion of potential deposition positions and is made inactive when located at a different portion of potential deposition positions during formation of a given layer.

10. The process of claim 9 wherein a resolution achieved in forming the given layer is better than that of a net area defined by the potential deposition positions at which a given cell is positioned during the formation of the given layer.

11. The process of claim 7 wherein the cell is made either inactive when located at each potential deposition position to which it is positioned during deposition of a given material during formation of a given layer or is made active when positioned at each potential deposition position to which it is positioned during deposition of a given material during formation of a given layer.

12. The process of claim 11 wherein a resolution achieved in forming the given layer is substantially defined by a net area defined by the potential deposition positions at which a given cell is positioned during the formation of the given layer.

13. The process of claim 7 wherein at least a portion of the offsets of a cell result in locating the cell to a potential deposition position that is substantially in registration with a potential deposition position from a previous registration of the cell on the given layer.

14. The process of claim 7 wherein at least a portion of the offsets of a cell result in locating the cell to a potential deposition position that does not substantially overlap a potential deposition position from a previous registration of the cell on the given layer.

15. The process of claim 1 wherein the multi-cell mask comprises a plurality of rectangular cells laid out in a rectangular grid.

16. The process of claim 15 wherein the rectangular cells are square.

17. The process of claim 1 wherein, the operation of at least a portion of the cells of the multi-cell mask is tested by electroplating material using the mask and examining the resulting depositions.

18. The process of claim 17 wherein any cells found to be faulty are labeled and the use of any faulty cells is avoided.

19. The process of claim 6 wherein deposition from cells is tracked.

20. The process of claim 6 wherein at least are portion of the cells are redressed by replenishing their electrodepositable material.

21. The process of claim 20 wherein any electrodepositable material remaining in cells to be redressed is removed prior to replenishing of the electrodepositable material.

22. The process of claim 7 where a planarization process occurs between at least two offsets and prior to a total deposition thickness reaching a desired deposition thickness for the layer.

23. A process for modifying a substrate, comprising:

(a) supplying a substrate on which one or more successive depositions of one or more materials may have occurred;

(b) supplying a multi-cell mask, wherein each cell is separated from other cells by a material, wherein the cells of the mask comprise independently controllable electrodes, and wherein a pattern of dielectric material extends beyond the cell electrodes for contacting the substrate and for forming electrochemical process pockets when such contact is made;

(c) bringing the multi-cell mask and the substrate into contact such that electrochemical process pockets are formed having a desired registration with respect to any previous depositions and providing a desired electrolyte solution such that the solution is provided within the electrochemical process pockets; and (d) applying a desired electrical activation to at least one desired cell electrode, to the substrate, and to any other desired electrode or electrodes, such that a desired material is selectively deposited onto the substrate.

24. The process of claim 23 wherein there is no other desired electrode or electrodes.

* * * * *